(12) United States Patent
Baldemair et al.

(10) Patent No.: US 12,381,607 B2
(45) Date of Patent: Aug. 5, 2025

(54) DATA SIGNALING FOR WIRELESS COMMUNICATION NETWORKS

(71) Applicant: Telefonaktiebolaget LM Ericsson (publ), Stockholm (SE)

(72) Inventors: Robert Baldemair, Solna (SE); Qiang Zhang, Täby (SE); Mattias Frenne, Uppsala (SE); Ajit Nimbalker, Fremont, CA (US)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/243,164

(22) Filed: Apr. 28, 2021

(65) Prior Publication Data

US 2022/0352936 A1    Nov. 3, 2022

(51) Int. Cl.
| H04B 7/06 | (2006.01) |
| H04L 1/00 | (2006.01) |
| H04L 27/00 | (2006.01) |
| H04L 27/20 | (2006.01) |
| H04L 27/36 | (2006.01) |

(52) U.S. Cl.
CPC ............ *H04B 7/06* (2013.01); *H04L 1/0057* (2013.01); *H04L 1/0071* (2013.01); *H04L 27/0012* (2013.01); *H04L 27/20* (2013.01); *H04L 27/36* (2013.01)

(58) Field of Classification Search
CPC .......... H04B 7/06; H04L 27/36; H04L 27/20; H04L 1/0071; H04L 1/0057; H04L 27/0012
See application file for complete search history.

(56) References Cited

U.S. PATENT DOCUMENTS

| 9,008,011 | B2 | 4/2015 | Seo et al. |
| 11,171,737 | B2* | 11/2021 | Liu ............................. H04L 1/18 |
| 2004/0141457 | A1* | 7/2004 | Seo ...................... H04L 27/2675 370/350 |
| 2006/0109925 | A1* | 5/2006 | Kannan .................. H04L 5/0044 375/260 |
| 2007/0283216 | A1* | 12/2007 | Kyung ................ H03M 13/255 714/758 |
| 2010/0208680 | A1* | 8/2010 | Nam ...................... H04L 5/0023 370/329 |

OTHER PUBLICATIONS

International Search Report and Written Opinion dated Jan. 21, 2022 for International Application No. PCT/SE2021/050920 filed Sep. 22, 2021, consisting of 14-pages.
3GPP TSG RAN WG1 #88bis R1-1705574; Title: CW to layer mapping and frequency domain interleaving; Agenda Item: 8.1.2.1.1; Source: Qualcomm Incorporated; Document for: Discussion/Decision; Date and Location; Apr. 3-7, 2017, Spokane, USA, consisting of 16-pages.

\* cited by examiner

*Primary Examiner* — Kabir A Timory
(74) *Attorney, Agent, or Firm* — Weisberg I.P. Law, P.A.

(57) ABSTRACT

There is disclosed a method of operating a transmitting radio node in a wireless communication network. The method includes transmitting data signaling utilising a plurality of transmission sources, wherein the data signaling represents a plurality of code blocks. Modulation symbols of a modulation symbol sequence are mapped to the plurality of transmission sources in c-tuples, the modulation symbol sequence representing the plurality of code blocks in which c is dependent on the modulation used for transmitting the signaling. The disclosure also pertains to related devices and methods.

19 Claims, 6 Drawing Sheets

DATA SIGNALING FOR WIRELESS COMMUNICATION NETWORKS

TECHNICAL FIELD

This disclosure pertains to wireless communication technology, in particular for high frequencies.

BACKGROUND

For future wireless communication systems, use of higher frequencies is considered, which allows large bandwidths to be used for communication. However, use of such higher frequencies brings new problems, for example regarding physical properties and timing. Ubiquitous or almost ubiquitous use of beamforming, with often comparatively small beams, may provide additional complications that need to be addressed; also, new waveforms may be considered, e.g. to facilitate low PAPR.

SUMMARY

It is an object of this disclosure to provide improved approaches of handling wireless communication, in particular of data signaling, for example for multi-layer transmission. The approaches are particularly suitable for millimeter wave communication, in particular for radio carrier frequencies around and/or above 52.6 GHz, which may be considered high radio frequencies (high frequency) and/or millimeter waves. The carrier frequency/ies may be between 52.6 and 140 GHz, e.g. with a lower border between 52.6, 55, 60, 71 GHz and/or a higher border between 71, 72, 90, 114, 140 GHz or higher, in particular between 55 and 90 GHz, or between 60 and 72 GHz; however, higher frequencies may be considered. The carrier frequency may in particular refer to a center frequency or maximum frequency of the carrier. The radio nodes and/or network described herein may operate in wideband, e.g. with a carrier bandwidth of 1 GHz or more, or 2 GHz or more, or even larger, e.g. up to 8 GHz; the scheduled or allocated bandwidth may be the carrier bandwidth, or be smaller, e.g. depending on channel and/or procedure. In some cases, operation may be based on an OFDM waveform or a SC-FDM waveform (e.g., downlink and/or uplink), in particular a FDF-SC-FDM-based waveform. However, operation based on a single carrier waveform, e.g. SC-FDE (which may be pulse-shaped or Frequency Domain Filtered, e.g. based on modulation scheme and/or MCS), may be considered for downlink and/or uplink. In general, different waveforms may be used for different communication directions. Communicating using or utilising a carrier and/or beam may correspond to operating using or utilising the carrier and/or beam, and/or may comprise transmitting on the carrier and/or beam and/or receiving on the carrier and/or beam.

The approaches are particularly advantageously implemented in a $5^{th}$ or $6^{th}$ Generation (5G) telecommunication network or 5G radio access technology or network (RAT/RAN), in particular according to 3GPP ($3^{rd}$ Generation Partnership Project, a standardization organization). A suitable RAN may in particular be a RAN according to NR, for example release 15 or later, or LTE Evolution. However, the approaches may also be used with other RAT, for example future 5.5G or 6G systems or IEEE based systems.

There is disclosed a method of operating a transmitting radio node in a wireless communication network. The method comprises transmitting data signaling utilising a plurality of transmission sources. The data signaling represents a plurality of code blocks. Modulation symbols of a modulation symbol sequence are mapped to the plurality of transmission sources in c-tuples. The modulation symbol sequence represents the plurality of code blocks. c is dependent on, and/or based on, and/or represents, and/or indicates, the modulation used for transmitting the signaling.

A transmitting radio node for a wireless communication network is proposed. The transmitting radio node is adapted for data signaling utilising a plurality of transmission sources. The data signaling represents a plurality of code blocks. Modulation symbols of a modulation symbol sequence are mapped to the plurality of transmission sources in c-tuples, the modulation symbol sequence representing the plurality of code blocks. c is dependent on, and/or based on, and/or represents, and/or indicates, the modulation used for transmitting the signaling.

Moreover, a method of operating a receiving radio node in a wireless communication network is suggested. The method comprises receiving data signaling, the data signaling being transmitted utilising a plurality of transmission sources, wherein the data signaling represents a plurality of code blocks. Modulation symbols of a modulation symbol sequence are mapped to the plurality of transmission sources in c-tuples. The modulation symbol sequence represents the plurality of code blocks. c is dependent on, and/or based on, and/or represents, and/or indicates, the modulation used for transmitting the signaling.

A receiving radio node for a wireless communication network is also considered. The receiving radio node is adapted for receiving data signaling, the data signaling being transmitted utilising a plurality of transmission sources, wherein the data signaling represents a plurality of code blocks. Modulation symbols of a modulation symbol sequence are mapped to the plurality of transmission sources in c-tuples, the modulation symbol sequence representing the plurality of code blocks. c is dependent on, and/or based on, and/or represents, and/or indicates, the modulation used for transmitting the signaling.

The data signaling may be considered to carry the code blocks, and/or modulation symbols representing the information of the code blocks, e.g. information or payload bits and/or error coding bits, e.g. CRC and/or FEC bits. Each of the code blocks may comprise payload bits and/or error correction coding bits and/or error detection coding bits (e.g., FEC and/or CRC, respectively). A modulation symbol sequence may be considered to represent a plurality of code blocks if the modulation symbols of the sequence represent and/or carry the bits of the code blocks, e.g. associated to a representation in constellation space. The bits may be mapped to modulation symbols based on the modulation (or modulation scheme, or MCS) being used. A modulation may in general be associated to, and/or represented by, a modulation scheme, or a modulation and coding scheme (MCS), and/or may be indicated by, and/or indexed to a table, e.g. a MCS table. An order of the modulation may indicate the possible values (e.g., associated to positions in constellation space) represented by a modulation symbol according to the modulation. Larger orders (associated to higher modulations) may allow larger values, and may carry more bits per symbol. Mapping to a plurality of transmission sources based on c-tuples may correspond to consecutive c-tuples (each c-tuple consisting of c consecutive modulation symbols) of the sequence being mapped to different layers; in particular, neighbouring c-tuples of the sequence may be mapped to different layers. The number of transmission sources may be 2 or larger, or 3 or larger, or 4 or larger. c may be an integer number, e.g. 1 or larger. Different values of c may be associated to different modulations. It may be considered that transmission associated to all transmission sources uses the same modulation and/or MCS, and/or is intended for the same receiving radio node. c-tuples of modulation symbols associated or mapped to a transmission source may be considered to be transmitted by the source and/or utilising the source, and/or carried by the transmission source, e.g. a layer. In general, each c-tuple with c being even may comprise or consist of one or more pairs of interlinked modulation symbols, e.g. if interlinking modulation is used.

Approaches described herein facility multi-layer or multi-transmission source transmission, e.g. for providing transmission diversity. In particular for interlinking modulation, approaches may facilitate mapping of interlinked modulation symbols to the same layer, e.g. for maintaining low PAPR.

It may be considered that for (e.g., at least two, or three or more) different sets of modulations, and/or for different (e.g., at least two, or three or more) modulations, c is different. Thus, flexibility in mapping may be provided.

For a first set of modulations, c may be 2 and/or c may be even. This may allow keeping an interlinking relation between modulation symbols alive, e.g. between a Re and Im part of a symbol pair.

For a second set of modulations, c may be 1, and/or c may be odd. This may in particular be suitable for non-interlinking modulations. For example, more flexible mapping is facilitated.

In particular, for pi/2*BPSK modulation, and/or an interlinked modulation, c may be 2 or an even number larger than 2.

In some variants, for a QAM-based modulation, and/or QPSK, c may be 1 or an odd number larger than 1.

The different transmission sources may correspond to different layers of transmission. Thus, multi-layer transmission may be facilitated, with layers carrying suitable tuples of modulation symbols; in particular, distribution of interlinked modulation symbols over layers may be avoided.

It may be considered that the code blocks of the plurality of code blocks may be associated to the same data block, e.g. code block bundle or transport block, and/or may be interleaved based on c. Interleaving may in general provide an output bit sequence based on the bits of the code blocks. The modulation symbol sequence may represent the data block and/or the code blocks associated thereto. For different data blocks, e.g. CBBs or transport blocks, different modulation symbol sequences may be used, and/or modulation symbol sequences may be mapped separately to transmission sources. Thus, order of data blocks may be ensured.

In some cases, interleaving may be performed on a code block basis and on a data block basis. Different interleavers may be used for code block based interleaving, and data block based interleaving; however, a combined interleaver providing both interleavings may be used instead. The data signaling may thus be provided with additional robustness against interference and/or disturbances.

It may be considered that the modulation symbol sequence may be based on interleaving of bits of the code blocks of the plurality of code blocks. The interleaving may provide an output bit sequence, based on which the modulation symbol sequence may be provided, e.g. by a modulator.

The transmission of the data signaling or data block or may in downlink, e.g. if the transmitting radio node is a network node, or in uplink or sidelink, e.g. if the transmitting radio node is a wireless device or terminal. The transmission may in particular utilise a SC-FDM based waveform (also referred to as DFT-s-OFDM based waveform), in which a DFT-spreading operation is used, e.g. before utilising a IFFT to provide time domain samples for transmission. Such waveforms may provide good PAPR characteristics for transmission, e.g. allowing optimised use of power amplifiers. However, the approaches may also provide consistent behaviour for other modulation schemes. In general, the terms "modulation", "modulation format", "modulation scheme" may pertain to the type of modulation used, e.g. BPSK, QAM, QPSK or similar; as such, they may be considered synonyms. The transmission sources may be synchronised, or quasi-synchronised, e.g. within a synchronisation threshold time shift. It may be noted that due to path effects, a timing shift between signaling from different transmission sources may appear for a receiver, which may be adapted to compensated for such, e.g. according to timing setup and/or cyclic prefix and/or configuration.

An interlinking modulation may be a modulation in which some modulation symbols are dependent on one or more other modulation symbols. For example, there may be a phase dependency between modulation symbols, e.g. a pair of modulation symbols, or an n-tuple of modulation symbols. In general, modulation symbols may represent the data blocks, e.g. one modulation symbol may represent one or more bits of a data block. Interlinked modulation symbols (also referred to as interlinked symbols) may represent bits of the data block. In general, a data block may comprise information bits (e.g., payload data or user data), and/or error coding bits, e.g. for error detection coding (for example, a CRC) and/or forward error coding. Different parts of a data block being transmitted utilising different transmission sources may comprise at least one, e.g. a first, part being transmitted utilising a first transmission source, and another, e.g. a second, part being transmitted utilising a second transmission source. A code block or data block may be represented by a set or sequence of bits, or by a set or sequence of modulation symbols. Modulation symbols (e.g., a set or sequence) representing the data block may also be referred to as codeword (CW). In general, bits or a sequence of bit may be mapped to transmission sources, e.g. layers, before modulation. In some cases, however, bits may be modulated, and then modulation symbols may be mapped to transmission sources, e.g. layers. Mapping may in general comprise interleaving. In general, interlinked modulation symbols may be mapped in sequence and/or consecutively in time domain.

The plurality or multiple of transmission sources may in particular consist of 2 transmission sources, e.g. for providing a rank 2 transmission or 2 layer transmission. However, cases with more than 2 transmission sources may be considered, e.g. 3 or more, 4 or more transmission sources or layers.

It may be considered that the data block or data signaling may be transmitted utilising a DFT-s-OFDM based waveform. Such waveform is particularly suited for low PAPR.

In general, data signaling may carry, and/or represent, one or more data blocks. A data block may be transmitted in a data block signaling time interval. In the data block signaling time interval, there may be transmitted a single data block (e.g., on multiple layers or using multiple transmission sources); optionally, reference signaling, e.g. DMRS, and/or control information (e.g., leading the data block in time) may be transmitted in the data block signaling time interval. The data block signaling time interval may consist of one or more than one allocation units, e.g. symbol time intervals (e.g., associated to OFDM symbols or DFT-s-OFDM symbols). Reference signaling may be associated to a reference allocation unit (e.g., a symbol).

Transmitting the data signaling or data block may be based on mapping the code blocks and/or the data block to the plurality of transmission sources and/or to one or more symbol time intervals, and/or on modulating bits of the data block and/or code blocks. A mapping of the data block or code blocks to transmission sources may map bits of the data block or code blocks to transmission sources (e.g., in a transmission source domain mapping), or modulation symbols representing the bits to transmission sources. Receiving may be based on a reverse operation or mapping. In general, the transmission of data signaling, e,g. a data block, may be part of data signaling covering one data block, or a plurality of data blocks, e.g. of unspecified duration and/or according to an allocation; different allocation types may be considered (e.g., configured, or dynamically scheduled).

It may be considered that the data signaling or data block is transmitted utilising a modulation from a set of modulations, the set including at least one interlinking modulation, e.g. pi/2*BPSK modulation and/or TCM or another form of interlinking modulation. Thus, a consistent approach of mapping may be used. The set may comprise non-interlinking modulations, e.g., one or more n-QAM based modulations. Which modulation to be used may be based on link adaptation, e.g. based on channel estimates and/or threshold values for signal quality and/or signal strength. For example, for low signal quality or signal strength, an interlinking modulation may be used. The modulation used may be signaled to a wireless device or terminal, e.g. in a DCI or scheduling grant (if the wireless device or terminal is the transmitting radio node) or a scheduling assignment (if the wireless device or terminal is the receiving radio node).

The data signaling or data block may be transmitted utilising pi/2*BPSK modulation. This modulation facilitates low PAPR, and may provide a good signal quality even in bad channel conditions. In this case, c may be 2, or correspond to an even integer, or an integer multiple or power of 2 that is larger than 2. It may be considered that the data signaling or data block may be transmitted utilising an interlinking modulation, wherein interlinked modulation symbols are transmitted utilising the same transmission source. In some variants, no interlinked symbols are transmitted utilising different transmission sources; however, it may be considered that (e.g., exactly, or a single) one modulation symbol transmitted utilising a transmission source may be linked to another modulation symbol transmitted utilising another transmission source.

It may be considered that a data block may be a code block bundle or transport block. The data block may comprise the one or more code blocks. Each code block or data block may be associated to a different acknowledgement process, e.g. HARQ process.

In general, to different transmission sources, there may be associated different reference signaling sequences. Reference signaling references may be shifted relative to each other, e.g. based on the same root sequence, or may be based on different root sequences. Thus, correct association of signaling utilising different transmission sources may be facilitated.

It may be considered that bits of the code blocks or a data block are mapped to layers, or transmission sources, before performing modulation. Thus, interlinked modulation symbols may be mapped to the same transmission source with low computation effort. However, in some cases, mapping to transmission sources or layers may be performed after modulation, such that modulation symbols may be mapped to transmission sources. The mapping may be such that interlinked symbols are mapped to the same transmission source, e.g. using a suitable interleaver.

In general, a data block may be transmitted in a data block signaling time interval consisting of one or more allocation units. Bits of the data block, or modulation symbols representing it (based on it, e.g. after modulation) may be distributed across different transmission sources.

It may be considered that the code blocks or the data block may be mapped based on a time domain mapping before a symbol domain mapping, for example for a data block transmitted over multiple symbol time intervals or allocation units. This may facilitate keeping interlinked modulation symbols together.

It may be considered that the data block may correspond to a code block bundle (CBB) and/or one or more code blocks. In some cases, it may be a transport block, which may comprise, and/or have associated to it a joint error coding or CRC covering all the code blocks included the transport block. The transport block may in general one or more code blocks.

It may be considered that the data signaling represents one occurrence of data signaling, e.g. covering a data block signaling time interval, and/or one transmission on a data channel like PDSCH or PUSCH or PSSCH. The data signaling may be part of a longer data signaling sequence, which may cover, and/or be embedded in, and/or represent a data transmission (time) interval, and/or be of unspecified duration. Data signaling occurrences may be scheduled or configured jointly, e.g. with a scheduling grant or assignment, or separately, e.g. with multiple scheduling assignments. A data block signaling time and/or data signaling sequence may comprise at least 4, or at least 8 data signaling occurrences and/or data block signaling time intervals. It may be considered that to each data block signaling time interval, there is associated on allocation unit associated to reference signaling associated to the data block of the data block signaling time interval. The data transmission time and/or data signaling sequence may comprise these allocation units associated to reference signaling; each of these allocation units may represent a reference allocation unit for the directly preceding data block signaling time interval and/or data block and/or associated data signaling (excepting the earliest of the data block signaling time intervals in the sequence and/or data transmission time).

It may be considered that the data signaling comprises control information preceding the data block in time domain. The control information may be considered part of the data signaling. In some variants, the control information may be mapped to, and/or carried on exactly one allocation unit. In particular, no signaling representing the data block or parts thereof may be associated to this allocation unit. The allocation unit carrying the control information may be a first (earliest) allocation unit of the data block signaling time interval and/or may be the starting allocation unit; in some variants, it may be mapped to and/or associated to and/or carried on the allocation unit preceding the starting allocation unit. Front-loaded DM-RS and/or an allocation unit associated thereto may be leading in time and/or neighbouring to the allocation unit associated to control information. The same DM-RS and/or transmission parameter/s may be associated and/or used for the control information and signaling carrying the data block. The control information may be considered part of the data signaling in some cases, but not part of the data block. The control information may be UCI (e.g., in uplink) or DCI (in downlink) or SCI (in sidelink), and/or be mapped to a MAC control element.

(Error) coding of control information may be separate from error coding of the data block or code block/s thereof. The allocation unit associated to the control information may neighbour in time at least one allocation unit carrying the data block and/or data signaling carrying the data block or parts thereof.

It may be considered that the data block is mapped to allocation units to be carried by data signaling.

It may be considered that reference allocation units occur periodically, e.g. configured and/or configurable and/or pre-defined. The periodic occurrence may be relevant for at least a data transmission time. The occurrence of reference allocation units (which in general may be associated to and/or carry DM-RS) may be basis for the data block size. In general, the data block size may be dependent on one or more additional parameters, in particular transmission parameter/s, for example MCS and/or code rate.

It may be considered that for multiple occurrences of data signaling, each data block may be associated to a different acknowledgement signaling process and/or different ranges of processes. A range of processes may comprise one or more acknowledgement signaling processes (e.g., HARQ processes); different ranges may comprise at least one non-shared (between the ranges) process.

A data block signaling time interval may correspond to the number of allocation units or symbols carrying the data block or parts thereof, and/or data signaling, and/or of one data signaling occurrence. A data transmission (time) interval may comprise and/or be associated to multiple data signaling occurrences and/or be associated to multiple data blocks and/or data block signaling time intervals. In some variants, a data transmission (time) interval may comprise and/or cover at least or exactly 5, or at least or exactly 10 or at least or exactly 20 data signaling occurrences and/or data block signaling time intervals.

It may in general be considered that a data block is part of itself. Different parts of a data block may comprise and/or represent different bits of the data block, e.g. information bits and/or coding bits. In general, a part of a data block may comprise and/or represent information (payload) bits and/or coding bits. In some cases, a data block may be represented by a code block; in other cases, a part of a data block may be a code block (e.g., if the data block comprises more than one code block). The size of a code block or data block may be represented or representable in bits, and/or in allocation units covered by it or required to carry it. This may be dependent on, and/or associated to bit size (e.g., in information bits, or information bits and error detection bits, and/or information bits and error detection and correction bits, depending on reference used) and/or bandwidth and/or MCS, in particular modulation; alternatively, or additionally, the bit size may be associated to and/or based on the number of symbols available. A code rate may indicate how many coding bits are used (high code rate may indicate low number of coding bits). The coding bits may be error coding bits, in particular for error detection coding (e.g., CRC) and/or error correction coding, e.g. FEC like polar coding and/or LPDC based coding or Muller-Reed coding or Turbo coding or similar. To different data blocks, there may associated the same code rate, or in some cases, different code rates. The associated code rate may be a maximum code rate. To each allocation unit, different parts of the data blocks may be associated, e.g. such that each allocation unit not carrying and/or not associated to reference signaling carries a different part. A data block may be mapped to, and/or associated to an integer number of allocation units. It may be considered that no allocation unit is associated to parts of different data blocks, or to different data blocks. Different parts of the same data block may be mapped to subsequent (in time) and/or neighbouring allocation units. Two subsequent allocation units may in general be arranged such that they share a border in time domain, such that an earlier allocation unit ends when the later subsequent allocation unit begins. A series of subsequent allocation units may represent the data block signaling time interval, e.g., in the numbers discussed above. Subsequent allocation units may be considered continuous in time.

In general, an allocation unit may correspond to a symbol time duration, e.g. of an OFDM symbol and/or SC-FDM symbol. The data signaling may utilise an OFDM-based waveform, in particular a SC-FDM based waveform (which is also referred to as DFT-s-OFDM based waveform, and can be considered to be an OFDM-based waveform). A data block may comprise, and/or consist of, one or more code blocks; code blocks may be associated to data blocks and/or allocation units according to, and/or based on, a code block distribution. The position and/or arrangement of reference signaling may be indicated and/or configured, e.g. with higher layer signaling and/or with physical layer control signaling like DCI.

An allocation unit may be considered associated to signaling and/or a data block (or part thereof) if it carries and/or is intended to carry the signaling, e.g. reference signaling) and/or signaling representing the data block. For example, information and/or coding bits associated to a data block or part thereof may be mapped to the allocation unit, e.g. in time and/or frequency and/or code domain. The allocation unit may carry may be intended to carry one or more modulation symbols representing information of the data block (e.g., information/payload and/or coding bits).

Communicating utilising data signaling may correspond to transmitting and/or receiving the data signaling. Transmitting data signaling may comprise mapping information and/or error coding into a data block, e.g. according to a data block size. Transmitting data signaling may comprise scheduling the data signaling for reception by a receiver (e.g., another radio node, in particular a wireless device) and/or may be based on a resource allocation, which may be configured or scheduled, e.g. by a network node. Receiving data signaling may comprise monitoring an allocation unit associated to reference signaling for reference signaling and/or the allocation unit/s associated to a data block and/or control information for such, e.g. assuming the data signaling is according to the data block size, e.g. to demodulate and/or decode the data block. Receiving may be based on, and/or according to, a resource allocation, which may be configured or scheduled to a transmitter by the receiver (e.g., if transmitted by a wireless device; a network node may receive data signaling according to the resource allocation, which it may have indicated to the wireless device), or received from the transmitter (or the network; e.g. if a wireless device has resources allocated for scheduled or configured data signaling it should receive).

The size of data blocks and/or code blocks may be such that an integer number fits into an interval between allocation units carrying DM-RS, e.g. without leaving an allocation unit of interval without associated part of a data block (e.g., empty). Thus, resource use may be optimised. Code block size (a code block may be considered a subblock of a data block or code block bundle, or represent a data block only comprising the code block as single code block) and/or data block size may be from a set of sizes, which may allow such mapping and/or code block distribution.

It may be considered that a data block corresponds to a code block bundle (CBB). The CBB may comprise one or more code blocks. It may be considered that different CBBs have the same size; in some cases, different CBBs may have different sizes. The size of a CBB may be represented or representable in number of code blocks and/or bits. Different sizes may be due to different modulation used. Same-sized data blocks or code blocks or CBBs in general (at least if the same modulation and/or MCS is used) may comprise and/or represent the same number of information bits (also referred to as payload or user bits) and/or code rate. However, in some cases, e.g. if reference signaling is embedded in time domain in a data block, same-sized code blocks and/or CBBs or data blocks may have different number of information bits and/or code rate.

Alternatively, or additionally, the number of data blocks and/or size of one or more of the data blocks (and/or of a code block or code block bundle) may be dependent on a modulation and/or coding scheme (MCS) used for transmitting the data signaling, in particular the data blocks. The modulation and/or coding scheme may in particular refer to the modulation (e.g., QPSK, n-QAM) and/or number of constellation points per modulation symbol and/or the error coding used, in particular the error correction coding. Parts of the same data block may be transmitted with the same modulation and/or coding scheme. Different data blocks may be transmitted with the same or different schemes, in particular re: modulation and/or coding. Thus, optimised transmission and resource utilisation may be provided.

In general, the number of data blocks and/or the size of the one or more data blocks may be from a set of numbers containing numbers dividing the number of allocation units of a data transmission interval, e.g. without rest, and/or such that the number of allocation units of the data transmission interval is an integer multiple (1 or more) of each of the numbers of the set (each of the numbers of the set may be an integer number; the numbers may be different; the set may comprise one or more numbers). The largest number of the set may be equal to the number of allocation units (SI) of the data transmission interval.

It may be considered that the reference signaling may be and/or comprise Demodulation Reference Signaling, DMRS, e.g. each instance associated to one data block. DMRS may be considered associated to a data block if it allows and/or is intended to allow demodulation of the signaling associated to the data block. In some cases, reference signaling may alternatively, or additionally, comprise a second form of reference signaling, e.g. user-specific RS and/or Phase-Tracking (PT) Reference Signaling, and/or time tracking (TT) Reference Signaling. In particular, a first reference allocation unit may be associated to DMRS, and a second or third may be associated to PT-RS. The second type of RS allows great flexibility, and/or may facilitate phase correction and/or timing correction, e.g. to handle large path delays.

In general, to each allocation unit carrying data signaling, there may be associated a cyclic prefix (depending on waveform), which may lead in time domain.

DMRS on different reference allocation units may be based on the same or different sequences, and/or may have the same or different cyclic shift. If the same form of DMRS is used, it may be easier to provide high signal resolution; different forms may help to overcome strongly fluctuating interferences.

It may be considered that different data blocks may be transmitted with the same modulation and coding scheme, e.g. in a data transmission interval. This simplifies reception, as circuitry does not have to be adapted to handle shifting transmission parameters. However, in some cases, e.g. if the data blocks represent a mix of newly transmitted data and retransmissions, it may be useful to use different MCS for different data blocks and/or code block bundles.

It may be considered that each data block (and/or code block and/or code block bundle) may be associated to a different acknowledgement signaling process and/or different processes, e.g. different ranges of processes. Different processes may be associated to different process IDs and/or data (sub-) streams and/or transmission layers and/or buffers (e.g., for soft combining).

In general, it may be considered that a code block represents a part of a data block and/or CBB. A part of a data block associated to an allocation unit may be a code block, or a different part (e.g., smaller or larger than one code block, and/or comprising parts of more than one code block).

Communication may be based on TDD. Communicating may in general comprise transmitting and/or receiving signaling, e.g. data signaling. Communicating utilising or using data signaling may comprise transmitting or receiving data signaling, e.g. data signaling being transmitted according to the code block distribution. A node being configured for data signaling may be considered to be set up with, and/or provided with a configuration or indication of a code block distribution, and/or provided with the code block distribution and/or associated mapping, and/or the associated resource structure/s, e.g. with control signaling, e.g. physical layer signaling or higher layer signaling, in particular with scheduling assignment/s and/or grant/s and/or resource configuration using higher layer signaling, e.g. RRC signaling configuring resources for data signaling (and/or indicating the CB distribution, e.g. indicating a Code block bundle size, and/or CB and/or BS as discussed herein). A node being configured for indication signaling may be considered to be set up with, and/or provided with a configuration or indication of the code block distribution, and/or provided with the code block distribution and/or associated mapping, e.g. with control signaling, e.g. physical layer signaling or higher layer signaling. In general, a code block distribution may map all code blocks of a code block bundle to the allocation units of a (e.g., the same, like the first or a second) signaling resource structure.

The transmitting radio node may in general comprise, and/or be adapted to utilise, processing circuitry and/or radio circuitry, in particular a transmitter and/or transceiver, to process (e.g., trigger and/or schedule) and/or transmit data signaling and/or the data block, e.g. utilising the multiple transmission sources. The transmitting radio node may in particular be a wireless device or terminal or UE, or a network node, for example a base station or an IAB or relay node. In general, the transmitting radio node may comprise and/or be adapted for transmission diversity, and/or may be connected or connectable to, and/or comprise, antenna circuitry, and/or two or more independently operable or controllable antenna arrays or arrangements, and/or transmitter circuitries and/or antenna circuitries, and/or may be adapted to use (e.g., simultaneously) a plurality of transmission sources, e.g. antenna ports and/or antennas or antenna arrays or subarrays or antenna arrangements (e.g., for transmitting data signaling and/or associated reference signaling). Transmitting may comprise controlling transmission using transmission sources, e.g. the antenna array/s. The transmitting radio node may comprise multiple components and/or transmitters and/or TRPs (and/or be connected or connectable thereto) and/or be adapted to control transmission from such. Any combination of units and/or devices able to control transmission on an air interface and/or in radio as described herein may be considered a transmitting radio node.

The receiving radio node may comprise, and/or be adapted to utilise, processing circuitry and/or radio circuitry, in particular a receiver and/or transmitter and/or transceiver, to receive and/or process (e.g. receive and/or demodulate and/or decode and/or perform blind detection and/or schedule or trigger such) data signaling. Receiving may comprise scanning a frequency range (e.g., a carrier) for data signaling, e.g. at specific (e.g., predefined and/or configured) locations in time/frequency domain, which may be dependent on the carrier and/or system bandwidth. Such location/s may correspond to one or more location or resource allocations configured or indicated or scheduled or allocated to the transmitting radio node, for reception of data signaling. Such resources may for example be PDSCH resources (if the receiving radio node is a wireless device, for example), e.g. scheduled dynamically or configured, e.g. with DCI and/or RRC signaling, or PUSCH resources (for example, if the receiving radio node is a network node). The receiving radio node may in particular be a network node or base station, or an IAB node or relay node. However, in some cases, the receiving radio node may be implemented as a wireless device or terminal or UE. The receiving radio node may comprise one or more independently operable or controllable receiving circuitries and/or antenna circuitries and/or may be adapted to receive data signaling from the plurality of transmission resources, e.g. simultaneously and/or to operate using two or more antenna ports simultaneously, and/or may be connected and/or connectable and/or comprise multiple independently operable or controllable antennas or antenna arrays or subarrays. Receiving the data block may comprise combining signaling received from the transmission sources to construct the data block.

A data transmission interval may in general comprise and/or cover and/or consist of an integer multiple of BS. The CB code blocks may be considered to represent and/or implement a code block bundle. A code block distribution may be represented and/or indicated and/or configured by information indicating mapping code block/s to a signaling resource structure, e.g. in the abstract or a specific resource structure, e.g. the first signaling resource structure. The distribution may in particular be indicated or configured with physical layer signaling and/or higher layer signaling, e.g. RRC or MAC signaling.

Receiving data signaling may comprise and/or be based on decoding and/or demodulating data signaling, e.g. based on a configuration and/or scheduling information. Data signaling may be configured and/or scheduled for transmission and/or reception, e.g. by the network or a network node, for example with physical layer signaling and/or higher layer signaling. For example, a network node as signaling radio node may configure and/or schedule data signaling to be received by a wireless device, or as a receiving node, it may schedule or configure data signaling to be transmitted by a wireless device. Receiving may be based on the assumption that code blocks are mapped to allocation units as described herein. Transmitting data signaling may be based on and/or comprise, mapping information or data or corresponding bits to code blocks and/or allocation units, e.g. based on a modulation scheme and/or scheduling and/or operating conditions. A network node may be adapted to schedule and/or configure data signaling.

The data signaling may be signaling on a data channel, in particular a physical data channel like a PUSCH or PDSCH or PSSCH (depending, e.g., on the implementation of the signaling radio node and/or the receiving radio node). The data signaling may be beamformed. The data signaling may be at one occasion (e.g., one transmission of PUSCH or PDSCH). The data signaling may be uplink or downlink or sidelink signaling; the type of communication (e.g., transmitting or receiving) performed by a specific node in regard to the data signaling may be corresponding to the type or direction of signaling.

BS allocation units (of one data block and/or one occurrence of data signaling) may be contiguous in time domain, e.g. such that each allocation unit of the BS allocation unit neighbors two other allocation units of the BS allocation, with the exception of border allocation units, which may only neighbor one allocation unit of the BS allocation units (and border another allocation unit not carrying bits of the CB code blocks, assuming BS is large enough.

CB code blocks being associated to BS allocation units may refer to the code block/s and/or associated error coding, and/or error encoded code blocks being contained in the BS allocation units. BS may be 1 or larger than 1. CB may be 1 or larger than 1. The value/s of CB and/or BS may differ between transmissions and/or code block groups (each CB may belong to only one group). Thus, after CB code blocks have been transmitted in BS allocation units, different values for CB and/or BS may be used. In general, CB and/or BS may be based on operating conditions and/or network load and/or signal quality and/or signal strength (e.g., quality and/or strength based on measurement reports) and/or buffer status (e.g., of a buffer storing incoming user data).

It may be considered that a code block comprises, and/or is associated to error coding, e.g. error detection coding (like parity coding and/or CRC) and/or error correction coding (e.g., FEC, like polar coding and/or turbo coding and/or LDPC). The bits for error coding and/or the bits representing the error coded code block/s of the BS allocation units may be mapped to the BS allocation units, representing the CB code blocks being associated to the BS allocation units.

It may be considered that in some variants, one code block or data block may be contained in one allocation unit (in particular, only one code block, possibly including error coding or the error encoded representation), or one data block or code block may occupy multiple allocation units; for example, one data block or code block (in particular, only one code block, plus possibly error coding or the error encoded representation) may fully occupy the multiple allocation units, for example if one allocation unit is not sufficient. The data block size may in general be determined to allow such mapping to one or more allocation units.

It may be considered that to a code block or CBB, there is mapped (e.g., exactly) one packet data unit from at least one higher layer, for example a MAC (Medium Access Control) layer and/or an RLC (Radio Link Control) layer. Each packet data unit may comprise layer-specific header information. With this approach, parallel processing is facilitated even in the higher layers. In particular, a receiver may pass such structured information to higher layers, and/or a transmitter may pass information downwards from higher layers to the physical layer. Code blocks may be mapped to allocation units on a physical layer.

In some variants, the data signaling and/or a data block and/or CBB may comprise a plurality of code blocks, with independent error detection coding and/or error correction coding for each code block. Thus, error coding may only pertain to one code block, allow quick independent processing of code blocks. It may be considered that the data signaling or data block comprises a plurality of code blocks, wherein no collective error detection coding and/or error correction coding is included in and/or associated to the data signaling. The signaling may omit error coding covering more than one code block. For example, transport block level error coding may be omitted. Thus, fully independent or parallel processing is facilitated. A corresponding data block may be considered a code block bundle.

There is also described a program product comprising instructions causing processing circuitry to control and/or perform a method as described herein. Moreover, a carrier medium arrangement carrying and/or storing a program product as described herein is considered. An information system comprising, and/or connected or connectable, to a radio node is also disclosed.

The data signaling may be associated to a data channel, and/or a priority level. Different data signalings may be associated to different data channels, or different priority levels, e.g. for URLLC or other high priority signaling.

Transmission parameters may comprise in particular frequency resources and/or start (in time domain, e.g. in which allocation unit) and/or modulation and/or coding (in particular, modulation and coding scheme) and/or code rate and/or beam parameters, e.g. pertaining to the beam in which the data signaling is transmitted) and/or MIMO parameter/s and/or parameter/s indicating an arrangement of code blocks of the data signaling, and/or information regarding reception, e.g. antenna and/or beams for reception, and/or information indicative of a beam pair to use for transmission and/or reception.

An unspecified duration may indicate that the data signaling will be transmitted until an unspecified end, such that a receiver may have to listen and/or monitor resources accordingly. The end may be unspecified when starting, and/or the resources (in particular in time domain) to be monitored or used may be unspecified when starting or triggering the data signaling transmission. The unspecified duration may be within a transmission phase, e.g. a downlink transmission phase, for example in a TDD system. The transmission may utilise a single-carrier based waveform. The unspecified duration may extend at least over a plurality of allocation units, in particular at least over 10, or at least 20, or at least 50, or at least 100 allocation units, e.g. block symbols. The receiving radio node may be expected to be ready to monitor for, and/or to receive, data signaling and/or a stop or end and/or interruption indication. The timing for transmission and reception may be shifted relative to each other due to path traveling effects; however, the time structure of signaling may be considered to be essentially the same for transmitter and receiver. Data signaling may be scheduled or configured with unspecified duration, such that e.g. numerous data blocks and/or reference signalings are transmitted as indicated.

It may be considered that the data signaling is transmitted using constant transmission parameters, e.g. constant over the data transmission time. Such parameters may in particular indicate modulation and/or coding and/or modulation and coding scheme and/or transmission power and/or reference signaling density and/or bandwidth and/or frequency resources (e.g., bandwidth part and/or carrier) and/or waveform. Thus, the receiving radio node does not have to change associated reception parameters and/or circuitry settings.

A code block may in general represent bits of information (e.g., user data and/or payload) and/or error coding, and/or may be represented by a corresponding bit sequence. A code block (e.g., its bits or representation) may be mapped to one or more modulation symbols contained in the one or more allocation units (e.g., depending on modulation and/or coding scheme and/or bandwidth and/or waveform). The allocation unit may in some cases contain reference signaling, e.g. phase tracking reference signaling, which may for example be included as a sequence, e.g. in a fixed and/or predefined and/or configured or configurable location (e.g. in time domain) of the allocation unit. Control information like header information and/or similar from higher layers may be represented by the information bits of the code block. In general, a code block may be padded (e.g. with zeros or ones) to allow occupying an allocation unit, e.g. if the code block size otherwise is too small to fully occupy one allocation unit. Alternatively, padding signaling may be used, e.g. padding symbols associated to the allocation unit not completely filled by a code block and/or its error coded representation. An error coded representation of a code block may comprise bits representing the information of the code block and/or error detection coding and/or error correction coding; the information bits may be directly included, or transformed (e.g., when using polar coding for FEC). A code block bundle (CBB) may comprise a plurality of code blocks; the code blocks in a CBB may be encoded separately, e.g. such that there is no common error correction coding covering the CBB.

BRIEF DESCRIPTION OF THE DRAWINGS

The drawings are provided to illustrate concepts and approaches described herein, and are not intended to limit their scope. The drawings comprise.

DETAILED DESCRIPTION

In this disclosure, reference may be made to symbols. A symbol in this context may be considered an example of an allocation unit or block symbol, and these terms may be used interchangeably, e.g. for different waveforms. Also, reference is made to code blocks (CBs); however, analogous approaches may be assumed for CBB. The size of a code block (or CBB) may be represented by the number of symbols or allocation units it covers (which may depend on the size in bits, and/or bandwidth available for transmission of the data and/or the MCS). It may be generally considered that Symbols (allocation units) per CB may depend on bandwidth and MCS.

As an example, it may be assumed that a mapping of a single codeword or code block or CBB (representing a data block) to multiple layers using DFTS-OFDM is used. A mapping may comprise multiple mappings, e.g. sub- or partial mappings, which may be represented to be provided in an order; however, any mapping that may be represented or representable as outlined herein (e.g., isomorphic and/or equivalent mapping) may be seen as representing the same mapping. A mapping may be considered to be represented or representable by one or more functions and/or tables and/or relations, or a combination thereof.

In general, data signaling, e.g. of a data block or CBB, may represent and/or carry a plurality of code blocks CB), which may have different sizes E1, E2. For example, it may be considered that there may be $$C_1 \text{CBs of size } E_1 = 2 \cdot c \cdot Q_m \cdot \left\lfloor \frac{G}{2 \cdot c \cdot Q_m \cdot C} \right\rfloor$$

$$C_2 \text{CBs of size } E_2 = 2 \cdot c \cdot Q_m \cdot \left\lceil \frac{G}{2 \cdot c \cdot Q_m \cdot C} \right\rceil$$

$$C_2 = \text{mod}\left(\frac{G}{2 \cdot c \cdot Q_m}, C\right),$$

$C_1=C-C_2$, C is the number of CBs in the CBB, G is the number of coded bits in the CBB, $Q_m$ is the number of bits per modulation symbol The parameter c may determine how many modulation symbols are consecutively mapped to a layer (as an example of a transmission source, and may be dependent on the modulation used for transmission of the data signaling. In one example, c=1 QPSK, 16QAM, etc.

c=2 pi/2-BPSK: This ensures that pi/2-BPSK property is maintained after layer mapping Interleaving of bits from different code blocks may be performed, e.g. before modulation and/or layer mapping; the interleaving may be such that the desired mapping to a layer or transmission source may be facilitated.

Figure 1:
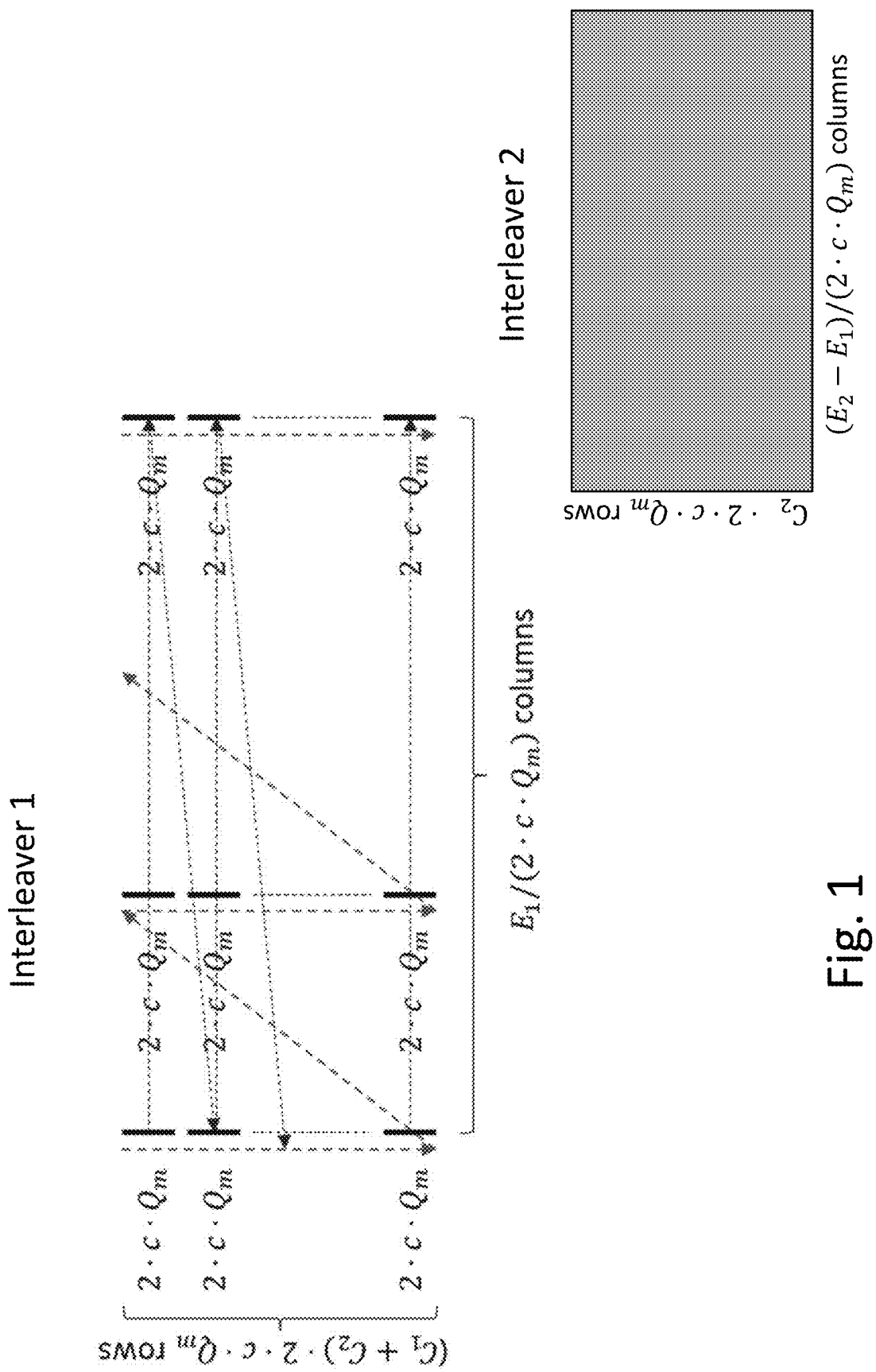
FIG. 1, showing an exemplary interleaving approach.

The following example may be considered, using two interleavers of different sizes as indicated in FIG. 1:

The data block or CBB or transport block in this example contains $C_1$CBs of size $E_1$ and $C_2$CBs of size $E_2(E_2>E_1)$.

Figure 2:
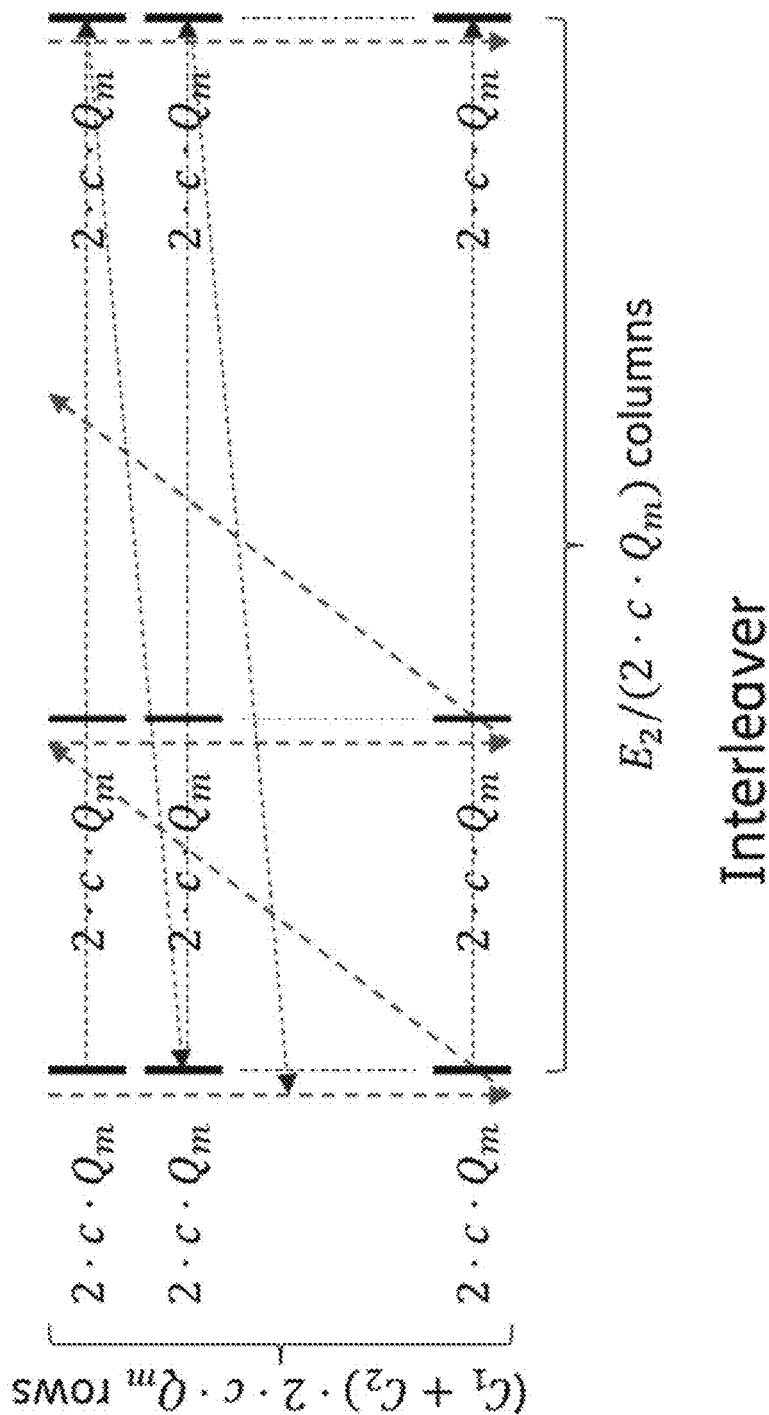
FIG. 2, showing another exemplary interleaving approach.

Interleaver 1: First, $E_1$ bits (bits $0 \ldots E_1-1$) of all CBs (in total $(C_1+C_2) \cdot E_1$ bits) are interleaved in a first rectangular interleaver of size $(C_1+C_2) \cdot 2 \cdot c \cdot Q_m \times E_1/(2 \cdot c \cdot Q_m)$ Interleaver 2: Second, $E_2-E_1$ bits (bits $E_1 \ldots E_2-1$) of $C_2$ large CBs are interleaved in a second rectangular interleaver of size $C_2 \cdot 2 \cdot c \cdot Q_m \times (E_2-E_1)/(2 \cdot c \cdot Q_m)$ For the Interleaver writing may be performed row-by-row (in units of $2 \cdot c \cdot Q_m$ bit), reading out of the interleaver may be column-by-column FIG. 2 shows another exemplary interleaving scenario with one interleaver being used. In this example, the data block or transport block or CBB contains $C_1$CBs of size $E_1$ and $C_2$CBs of size $E_2(E_2>E_1)$. The $C_1$ smaller CBs are padded to $E_2$ bits, for example, $E_2-E_1$ filler bits may be inserted. The $C_1+C_2$ $E_2$-sized CBs are now interleaved with a single interleaver of size $(C_1+C_2) \cdot 2 \cdot c \cdot Q_m \times E_2/(2 \cdot c \cdot Q_m)$ After interleaving, filler bits may be removed.

For this interleaving, writing may be performed row-by-row (in units of $2 \cdot c \cdot Q_m$ bit), reading out of the interleaver may be column-by-column.

Figure 3A:
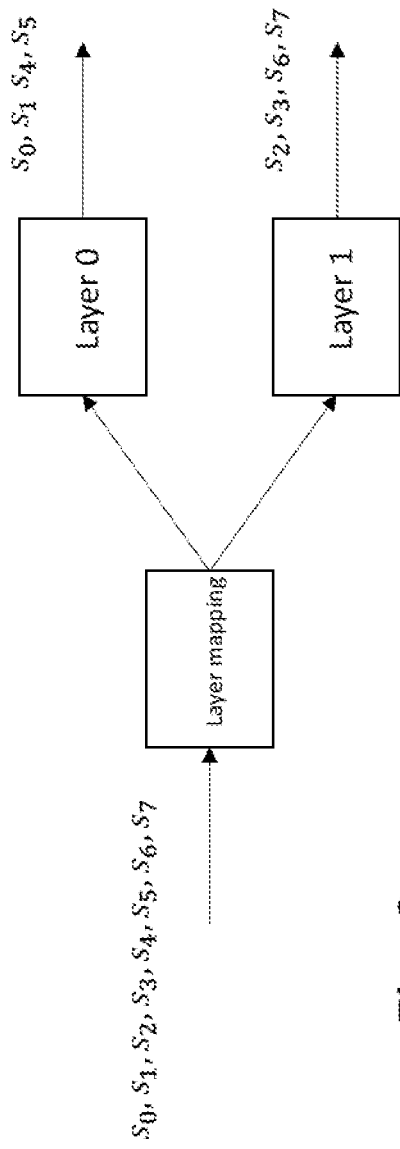
FIGS. 3a, 3b showing exemplary layer mapping scenarios.
Figure 3B:
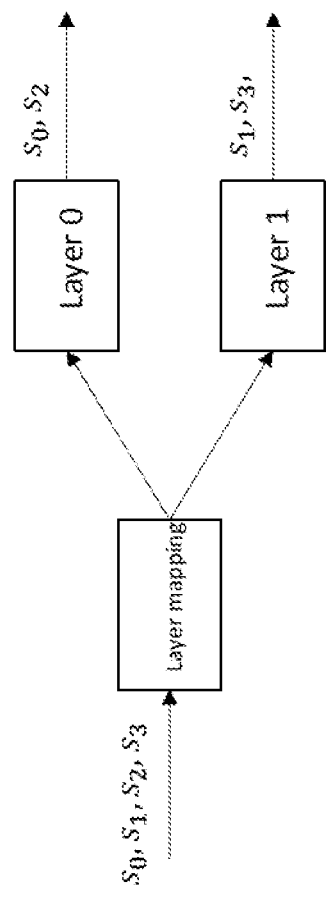

FIG. 3a, 3b show an exemplary layer mapping scenario. For a modulation of a first set of modulation (e.g., interlinking modulations), in the example pi/2-BPSK, the modulation symbols (after modulation of information bits) may be mapped in pairs or even-numbered tuples (e.g., c-tuple, with c=2, 4, 6, ...) to each layer; FIG. 3a shows how from a modulation symbol sequence (s0, ... s7, ... ) (which may be determined based on interleaving of bits from multiple code blocks, e.g. as shown in FIG. 1 or 2), 2-tuples or pairs of symbols (s0, s1) and (s4, s5) are mapped to layer 0, and pairs (s2, s3) and (s6, s7) are mapped to layer 1.

For a second set of modulations (e.g., QPSK, 16 QAM, ... ), modulation symbols of the sequence may be mapped in different sized tuples, in particular in 1-sized tuples (or individually, or odd sized tuples or tuples of any size. This is shown in FIG. 3b, where symbols of a modulation symbol sequence are mapped individually to the layers.

The modulation symbols may be mapped in c-tuples to the layers. In some examples, for pi/2-BPSK: c=2 (or any even number)

QPSK, 16 QAM, ... : c=1 (or any number, or any odd number, or any even number different from c for pi/2-BPSK.

Figure 4:
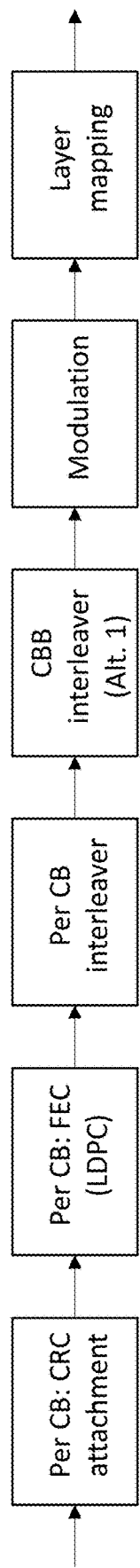
FIG. 4, showing an exemplary transmission setup.

An interleaver prior to the CBB interleaver (CBB interleaver operates across CBs) can be inserted to make sure systematic bits are placed at robust constellation points. This interleaver may work within a CB (e.g., it may be combined with CBB interleaver); this may be particularly beneficial at low code rates. FIG. 4 shows an exemplary transmitting arrangement. As input, there may be considered information bits associated to code blocks, which may be subject to CRC attachment per code block CB. FEC may be added for each CRC-encoded CB. Interleaving may be performed per CB. Then, interleaving on a CBB basis may be performed (in which the CBs are concatenated to the CBB), e.g. before interleaving. This may be according to the alternative shown in FIG. 1, or in FIG. 2, or another suitable way. Then, modulation may be performed to produce a modulation symbol sequence, which then may be layer mapped, e.g. according to the scheme described for FIGS. 3a and 3b.

A codeword may in general comprise and/or represent the modulation symbols representing a data block, and/or a data block may be considered to be represented by a codeword. The codeword may be determined based on an input bit sequence (e.g., coded bits representing the data block), and/or encoding (e.g., error coding) and/or modulation. In general, one codeword and/or data block may be mapped to multiple transmission sources.

A tuple may in general consist of consecutive symbols of a modulation symbol sequence; for example, a c-tuple may consist of c consecutive symbols of the sequence (c may be an integer >=1). The modulation symbols of a tuple may represent bits of the same code block, e.g. based on interleaving. The interleaving (e.g., using one or more interleavers) may be set up to provide a bit sequence or set of bits such that after modulation according to a modulation scheme, the tuples are formed as proposed. In some cases, a tuple or the tuples may represent bits from different code blocks, e.g. based on interleaving. The interleaving may be based on the modulation scheme, e.g. represented by c. A first set of modulation schemes may comprise one or more modulation schemes, e.g. one or more interlinking modulation schemes. A second set of modulation schemes may comprise one or more modulation schemes, e.g. one or more non-interlinking modulation schemes, and/or QAM or QPSK based modulation schemes; a third set, or even more sets may be considered, wherein each set may comprise different modulation schemes (each set comprising at least one). c may be different for different sets. In general, different tuples may be mapped to different layers or transmission sources. In general, it may be considered that to each transmission source, there are associated c-tuples of symbols of a modulation symbol sequence, wherein c may depend and/or be based on and/or be indicative of the modulation scheme (or set or modulation schemes).

It may in general be considered that symbols of a CBB or data block may be the symbol time intervals allocated for transmission of the CBB or data block, e.g. according to a dynamic scheduling and/or a configuration for a wireless device, and/or as scheduled by a network node or scheduler.

An interleaver, e.g. time domain interleaver, may in general be adapted to permutate an input sequence and/or to change its order. An input sequence may in general be for example a modulation symbol sequence or a bit sequence, e.g. in time domain. An interleaver (for example an interleaving function and/or a unit or circuitry adapted to perform the interleaving and/or to implement an interleaving function) may for example permutate or change the order of the input sequence provided as input, e.g. to provide a changed or permutated out sequence. In some cases, a reversal (e.g., reversal of the order of the elements/symbols of the sequence and/or time reversal) may be considered an exemplary form interleaving. Other form may be considered, e.g. exchanging the order pairwise, e.g. of neighbouring elements or of non-neighbouring elements, and/or exchanging elements block-wise. Exchanging in this context may refer to exchanging the location and/or order of elements of the input sequence for the output sequence, e.g., without introducing new elements (which were not elements of the input sequence). In general, the output (e.g., output sequence) of an interleaver may represent, and/or comprise, a permutation of an input (e.g., an input sequence). In some cases, padding or cyclic extension may be provided, e.g. to fill up the required input samples or elements for a unit following behind in the chain, e.g. for a unit performing transform precoding and/or an IFFT unit. An interleaver may provide an output mapped to one or more target domain/s. A target domain may for example be transmission resource domain, e.g. a layer domain (and/or antenna arrangement domain and/or beam domain and/or antenna port domain), or a time domain or symbol domain. A target domain may in general indicate that two or more members of the domain are available and/or mapped or mappable to, and/or may correspond to a related mapping. A time domain (or time domain mapping) may for example refer to a pre-DFT time domain or sequence, and/or to mapping within a symbol time interval or allocation unit (e.g., the same symbol time interval and/or symbol, e.g. OFDM symbol and/or DFT-s-symbol) and/or to individual available samples. A symbol domain (or symbol domain mapping) may refer to mapping to different symbols, e.g. OFDM symbols and/or DFT-s-symbols or allocation units). The number of symbols available for a mapping may be dependent on a time domain allocation or scheduling.

Transform precoding may refer to performing DFT-s-spreading, e.g. based on a subcarrier mapping of modulation symbols (in frequency domain. Transform precoding may comprise performing a subcarrier mapping (mapping modulation symbols to subcarriers), and/or may be performed base on such.

A transmission sources may for example be implemented as, and/or may comprise and/or represent, a TRP, and/or antenna arrangement and/or antenna and/or antenna array or subarray, and/or an antenna port and/or a layer. To a transmission source, there may be associated one or more processing circuitries and/or radio circuitries, e.g. for a transmitting radio node. A transmission source may be considered implemented as part of such, and/or to comprise, and/or be connected or connectable to, antenna circuitry and/or an antenna arrangement. Different transmission sources may be separable controllable, e.g. for separate and/or independent transmission, in particular for providing transmission diversity like spatial diversity and/or time domain diversity.

A receiving radio node may be adapted to perform reverse (receiving operation) in an analogous manner and/or comprise corresponding unit/s and/or circuitries. Each unit may be considered as part of circuitry, or as separate circuitry adapted for suitable communication with other unit/s, and/or may comprise hardware and/or software and/or firmware, and/or may be considered as and/or to comprise integrated circuitry. Functionality associated to a unit may be combined with functionality associated to another unit, e.g. in a unit providing the combined functionality. Before and behind in a branch may refer to the processing order and/or data or signaling flow; behind may also be referred to as downstream, before as upstream.

Figure 5:
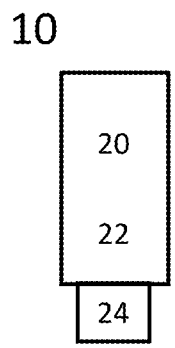
FIG. 5, showing an exemplary transmitting or receiving radio node, implementable as a terminal or wireless device or UE.

FIG. 5 schematically shows a radio node, in particular a wireless device or terminal 10 or a UE (User Equipment). Radio node 10 comprises processing circuitry (which may also be referred to as control circuitry) 20, which may comprise a controller connected to a memory. Any module of the radio node 10, e.g. a communicating module or determining module, may be implemented in and/or executable by, the processing circuitry 20, in particular as module in the controller. Radio node 10 also comprises radio circuitry 22 providing receiving and transmitting or transceiving functionality (e.g., one or more transmitters and/or receivers and/or transceivers), the radio circuitry 22 being connected or connectable to the processing circuitry. An antenna circuitry 24 of the radio node 10 is connected or connectable to the radio circuitry 22 to collect or send and/or amplify signals. Radio circuitry 22 and the processing circuitry 20 controlling it are configured for cellular communication with a network, e.g. a RAN as described herein, and/or for sidelink communication (which may be within coverage of the cellular network, or out of coverage; and/or may be considered non-cellular communication and/or be associated to a non-cellular wireless communication network). Radio node 10 may generally be adapted to carry out any of the methods of operating a radio node like terminal or UE disclosed herein; in particular, it may comprise corresponding circuitry, e.g. processing circuitry, and/or modules, e.g. software modules. It may be considered that the radio node 10 comprises, and/or is connected or connectable, to a power supply.

Figure 6:
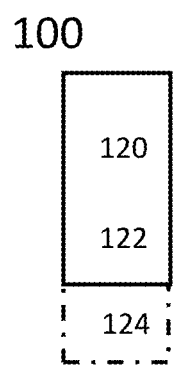
FIG. 6, showing another exemplary transmitting or receiving radio node, implementable as a network node.

FIG. 6 schematically show a radio node 100, which may in particular be implemented as a network node 100, for example an eNB or gNB or similar for NR. Radio node 100 comprises processing circuitry (which may also be referred to as control circuitry) 120, which may comprise a controller connected to a memory. Any module, e.g. transmitting module and/or receiving module and/or configuring module of the node 100 may be implemented in and/or executable by the processing circuitry 120. The processing circuitry 120 is connected to control radio circuitry 122 of the node 100, which provides receiver and transmitter and/or transceiver functionality (e.g., comprising one or more transmitters and/or receivers and/or transceivers). An antenna circuitry 124 may be connected or connectable to radio circuitry 122 for signal reception or transmittance and/or amplification. Node 100 may be adapted to carry out any of the methods for operating a radio node or network node disclosed herein; in particular, it may comprise corresponding circuitry, e.g. processing circuitry, and/or modules. The antenna circuitry 124 may be connected to and/or comprise an antenna array. The node 100, respectively its circuitry, may be adapted to perform any of the methods of operating a network node or a radio node as described herein; in particular, it may comprise corresponding circuitry, e.g. processing circuitry, and/or modules. The radio node 100 may generally comprise communication circuitry, e.g. for communication with another network node, like a radio node, and/or with a core network and/or an internet or local net, in particular with an information system, which may provide information and/or data to be transmitted to a user equipment.

In general, a block symbol may represent and/or correspond to an extension in time domain, e.g. a time interval. A block symbol duration (the length of the time interval) may correspond to the duration of an OFDM symbol or a corresponding duration, and/or may be based and/or defined by a subcarrier spacing used (e.g., based on the numerology) or equivalent, and/or may correspond to the duration of a modulation symbol (e.g., for OFDM or similar frequency domain multiplexed types of signaling). It may be considered that a block symbol comprises a plurality of modulation symbols, e.g. based on a subcarrier spacing and/or numerology or equivalent, in particular for time domain multiplexed types (on the symbol level for a single transmitter) of signaling like single-carrier based signaling, e.g. SC-FDE or SC-FDMA (in particular, FDF-SC-FDMA or pulse-shaped SC-FDMA). The number of symbols may be based on and/or defined by the number of subcarrier to be DFTS-spread (for SC-FDMA) and/or be based on a number of FFT samples, e.g. for spreading and/or mapping, and/or equivalent, and/or may be predefined and/or configured or configurable. A block symbol in this context may comprise and/or contain a plurality of individual modulation symbols, which may be for example 1000 or more, or 3000 or more, or 3300 or more. The number of modulation symbols in a block symbol may be based and/or be dependent on a bandwidth scheduled for transmission of signaling in the block symbol. A block symbol and/or a number of block symbols (an integer smaller than 20, e.g. equal to or smaller than 14 or 7 or 4 or 2 or a flexible number) may be a unit (e.g., allocation unit) used or usable or intended e.g. for scheduling and/or allocation of resources, in particular in time domain. To a block symbol (e.g., scheduled or allocated) and/or block symbol group and/or allocation unit, there may be associated a frequency range and/or frequency domain allocation and/or bandwidth allocated for transmission.

An allocation unit, and/or a block symbol, may be associated to a specific (e.g., physical) channel and/or specific type of signaling, for example reference signaling. In some cases, there may be a block symbol associated to a channel that also is associated to a form of reference signaling and/or pilot signaling and/or tracking signaling associated to the channel, for example for timing purposes and/or decoding purposes (such signaling may comprise a low number of modulation symbols and/or resource elements of a block symbol, e.g. less than 10% or less than 5% or less than 1% of the modulation symbols and/or resource elements in a block symbol). To a block symbol, there may be associated resource elements; a resource element may be represented in time/frequency domain, e.g. by the smallest frequency unit carrying or mapped to (e.g., a subcarrier) in frequency domain and the duration of a modulation symbol in time domain. A block symbol may comprise, and/or to a block symbol may be associated, a structure allowing and/or comprising a number of modulation symbols, and/or association to one or more channels (and/or the structure may dependent on the channel the block symbol is associated to and/or is allocated or used for), and/or reference signaling (e.g., as discussed above), and/or one or more guard periods and/or transient periods, and/or one or more affixes (e.g., a prefix and/or suffix and/or one or more infixes (entered inside the block symbol)), in particular a cyclic prefix and/or suffix and/or infix. A cyclic affix may represent a repetition of signaling and/or modulation symbol/s used in the block symbol, with possible slight amendments to the signaling structure of the affix to provide a smooth and/or continuous and/or differentiable connection between affix signaling and signaling of modulation symbols associated to the content of the block symbol (e.g., channel and/or reference signaling structure). In some cases, in particular some OFDM-based waveforms, an affix may be included into a modulation symbol. In other cases, e.g. some single carrier-based waveforms, an affix may be represented by a sequence of modulation symbols within the block symbol. It may be considered that in some cases a block symbol is defined and/or used in the context of the associated structure.

Communicating may comprise transmitting or receiving. It may be considered that communicating like transmitting signaling is based on a SC-FDM based waveform, and/or corresponds to a Frequency Domain Filtered (FDF) DFTS-OFDM waveform. However, the approaches may be applied to a Single Carrier based waveform, e.g. a SC-FDM or SC-FDE-waveform, which may be pulse-shaped/FDF-based. It should be noted that SC-FDM may be considered DFT-spread OFDM, such that SC-FDM and DFTS-OFDM may be used interchangeably. Alternatively, or additionally, the signaling (e.g., first signaling and/or second signaling) and/or beam/s (in particular, the first received beam and/or second received beam) may be based on a waveform with CP or comparable guard time. The received beam and the transmission beam of the first beam pair may have the same (or similar) or different angular and/or spatial extensions; the received beam and the transmission beam of the second beam pair may have the same (or similar) or different angular and/or spatial extensions. It may be considered that the received beam and/or transmission beam of the first and/or second beam pair have angular extension of 20 degrees or less, or 15 degrees or less, or 10 or 5 degrees or less, at least in one of horizontal or vertical direction, or both; different beams may have different angular extensions. An extended guard interval or switching protection interval may have a duration corresponding to essentially or at least N CP (cyclic prefix) durations or equivalent duration, wherein N may be 2, or 3 or 4. An equivalent to a CP duration may represent the CP duration associated to signaling with CP (e.g., SC-FDM-based or OFDM-based) for a waveform without CP with the same or similar symbol time duration as the signaling with CP. Pulse-shaping (and/or performing FDF for) a modulation symbol and/or signaling, e.g. associated to a first subcarrier or bandwidth, may comprise mapping the modulation symbol (and/or the sample associated to it after FFT) to an associated second subcarrier or part of the bandwidth, and/or applying a shaping operation regarding the power and/or amplitude and/or phase of the modulation symbol on the first subcarrier and the second subcarrier, wherein the shaping operation may be according to a shaping function. Pulse-shaping signaling may comprise pulse-shaping one or more symbols; pulse-shaped signaling may in general comprise at least one pulse-shaped symbol. Pulse-shaping may be performed based on a Nyquist-filter. It may be considered that pulse-shaping is performed based on periodically extending a frequency distribution of modulation symbols (and/or associated samples after FFT) over a first number of subcarrier to a larger, second number of subcarriers, wherein a subset of the first number of subcarriers from one end of the frequency distribution is appended at the other end of the first number of subcarriers.

In some variants, communicating may be based on a numerology (which may, e.g., be represented by and/or correspond to and/or indicate a subcarrier spacing and/or symbol time length) and/or an SC-FDM based waveform (including a FDF-DFTS-FDM based waveform) or a single-carrier based waveform. Whether to use pulse-shaping or FDF on a SC-FDM or SC-based waveform may depend on the modulation scheme (e.g., MCS) used. Such waveforms may utilise a cyclic prefix and/or benefit particularly from the described approaches. Communicating may comprise and/or be based on beamforming, e.g. transmission beamforming and/or reception beamforming, respectively. It may be considered that a beam is produced by performing analog beamforming to provide the beam, e.g. a beam corresponding to a reference beam. Thus, signaling may be adapted, e.g. based on movement of the communication partner. A beam may for example be produced by performing analog beamforming to provide a beam corresponding to a reference beam. This allows efficient postprocessing of a digitally formed beam, without requiring changes to a digital beamforming chain and/or without requiring changes to a standard defining beam forming precoders. In general, a beam may be produced by hybrid beamforming, and/or by digital beamforming, e.g. based on a precoder. This facilitates easy processing of beams, and/or limits the number of power amplifiers/ADC/DCA required for antenna arrangements. It may be considered that a beam is produced by hybrid beamforming, e.g. by analog beamforming performed on a beam representation or beam formed based on digital beamforming. Monitoring and/or performing cell search may be based on reception beamforming, e.g. analog or digital or hybrid reception beamforming. Beamforming may be performed based on one or more precoder/s. In particular, beamforming may be non-codebook based (without fixed and/or predefined and/or configured precoder/s); however, codebook based beamforming may be considered, in which configured and/or configurable beams from a set of beams may be used, and/or communication partners may agree on a set of precoders and/or beams, e.g. transmission beams. Beamforming may be based and/or correspond to and/or be referred to as MIMO operation and/or utilise a MIMO precoding, e.g. codebook-based or non-codebook based. A numerology may determine the length of a symbol time interval and/or the duration of a cyclic prefix. The approaches described herein are particularly suitable to SC-FDM, to ensure orthogonality, in particular subcarrier orthogonality, in corresponding systems, but may be used for other waveforms. Communicating may comprise utilising a waveform with cyclic prefix. The cyclic prefix may be based on a numerology, and may help keeping signaling orthogonal. Communicating may comprise, and/or be based on performing cell search, e.g. for a wireless device or terminal, or may comprise transmitting cell identifying signaling and/or a selection indication, based on which a radio node receiving the selection indication may select a signaling bandwidth from a set of signaling bandwidths for performing cell search.

A beam or beam pair may in general be targeted at one radio node, or a group of radio nodes and/or an area including one or more radio nodes. In many cases, a beam or beam pair may be receiver-specific (e.g., UE-specific), such that only one radio node is served per beam/beam pair. A beam pair switch or switch of received beam (e.g., by using a different reception beam) and/or transmission beam may be performed at a border of a transmission timing structure, e.g. a slot border, or within a slot, for example between symbols Some tuning of radio circuitry, e.g. for receiving and/or transmitting, may be performed. Beam pair switching may comprise switching from a second received beam to a first received beam, and/or from a second transmission beam to a first transmission beam. Switching may comprise inserting a guard period to cover retuning time; however, circuitry may be adapted to switch sufficiently quickly to essentially be instantaneous; this may in particular be the case when digital reception beamforming is used to switch reception beams for switching received beams.

A reference beam may be a beam comprising reference signaling, based on which for example a of beam signaling characteristics may be determined, e.g. measured and/or estimated. A signaling beam may comprise signaling like control signaling and/or data signaling and/or reference signaling. A reference beam may be transmitted by a source or transmitting radio node, in which case one or more beam signaling characteristics may be reported to it from a receiver, e.g. a wireless device. However, in some cases it may be received by the radio node from another radio node or wireless device. In this case, one or more beam signaling characteristics may be determined by the radio node. A signaling beam may be a transmission beam, or a reception beam. A set of signaling characteristics may comprise a plurality of subsets of beam signaling characteristics, each subset pertaining to a different reference beam. Thus, a reference beam may be associated to different beam signaling characteristics.

A beam signaling characteristic, respectively a set of such characteristics, may represent and/or indicate a signal strength and/or signal quality of a beam and/or a delay characteristic and/or be associated with received and/or measured signaling carried on a beam. Beam signaling characteristics and/or delay characteristics may in particular pertain to, and/or indicate, a number and/or list and/or order of beams with best (e.g., lowest mean delay and/or lowest spread/range) timing or delay spread, and/or of strongest and/or best quality beams, e.g. with associated delay spread. A beam signaling characteristic may be based on measurement/s performed on reference signaling carried on the reference beam it pertains to. The measurement/s may be performed by the radio node, or another node or wireless device. The use of reference signaling allows improved accuracy and/or gauging of the measurements. In some cases, a beam and/or beam pair may be represented by a beam identity indication, e.g. a beam or beam pair number. Such an indication may be represented by one or more signaling sequences (e.g., a specific reference signaling sequences or sequences), which may be transmitted on the beam and/or beam pair, and/or a signaling characteristic and/or a resource/s used (e.g., time/frequency and/or code) and/or a specific RNTI (e.g., used for scrambling a CRC for some messages or transmissions) and/or by information provided in signaling, e.g. control signaling and/or system signaling, on the beam and/or beam pair, e.g. encoded and/or provided in an information field or as information element in some form of message of signaling, e.g. DCI and/or MAC and/or RRC signaling.

A reference beam may in general be one of a set of reference beams, the second set of reference beams being associated to the set of signaling beams. The sets being associated may refer to at least one beam of the first set being associated and/or corresponding to the second set (or vice versa), e.g. being based on it, for example by having the same analog or digital beamforming parameters and/or precoder and/or the same shape before analog beamforming, and/or being a modified form thereof, e.g. by performing additional analog beamforming. The set of signaling beams may be referred to as a first set of beams, a set of corresponding reference beams may be referred to as second set of beams.

In some variants, a reference beam and/or reference beams and/or reference signaling may correspond to and/or carry random access signaling, e.g. a random access preamble. Such a reference beam or signaling may be transmitted by another radio node. The signaling may indicate which beam is used for transmitting. Alternatively, the reference beams may be beams receiving the random access signaling. Random access signaling may be used for initial connection to the radio node and/or a cell provided by the radio node, and/or for reconnection. Utilising random access signaling facilitates quick and early beam selection. The random access signaling may be on a random access channel, e.g. based on broadcast information provided by the radio node (the radio node performing the beam selection), e.g. with synchronisation signaling (e.g., SSB block and/or associated thereto). The reference signaling may correspond to synchronisation signaling, e.g. transmitted by the radio node in a plurality of beams. The characteristics may be reported on by a node receiving the synchronisation signaling, e.g. in a random access process, e.g. a msg3 for contention resolution, which may be transmitted on a physical uplink shared channel based on a resource allocation provided by the radio node.

A delay characteristic (which may correspond to delay spread information) and/or a measurement report may represent and/or indicate at least one of mean delay, and/or delay spread, and/or delay distribution, and/or delay spread distribution, and/or delay spread range, and/or relative delay spread, and/or energy (or power) distribution, and/or impulse response to received signaling, and/or the power delay profile of the received signals, and/or power delay profile related parameters of the received signal. A mean delay may represent the mean value and/or an averaged value of the delay spread, which may be weighted or unweighted. A distribution may be distribution over time/delay, e.g. of received power and/or energy of a signal. A range may indicate an interval of the delay spread distribution over time/delay, which may cover a predetermined percentage of the delay spread respective received energy or power, e.g. 50% or more, 75% or more, 90% or more, or 100%. A relative delay spread may indicate a relation to a threshold delay, e.g. of the mean delay, and/or a shift relative to an expected and/or configured timing, e.g. a timing at which the signaling would have been expected based on the scheduling, and/or a relation to a cyclic prefix duration (which may be considered on form of a threshold). Energy distribution or power distribution may pertain to the energy or power received over the time interval of the delay spread. A power delay profile may pertain to representations of the received signals, or the received signals energy/power, across time/delay. Power delay profile related parameters may pertain to metrics computed from the power delay profile. Different values and forms of delay spread information and/or report may be used, allowing a wide range of capabilities. The kind of information represented by a measurement report may be predefined, or be configured or configurable, e.g. with a measurement configuration and/or reference signaling configuration, in particular with higher layer signaling like RRC or MAC signaling and/or physical layer signaling like DCI signaling.

In general, different beam pair may differ in at least one beam; for example, a beam pair using a first received beam and a first transmission beam may be considered to be different from a second beam pair using the first received beam and a second transmission beam. A transmission beam using no precoding and/or beamforming, for example using the natural antenna profile, may be considered as a special form of transmission beam of a transmission beam pair. A beam may be indicated to a radio node by a transmitter with a beam indication and/or a configuration, which for example may indicate beam parameters and/or time/frequency resources associated to the beam and/or a transmission mode and/or antenna profile and/or antenna port and/or precoder associated to the beam. Different beams may be provided with different content, for example different received beams may carry different signaling; however, there may be considered cases in which different beams carry the same signaling, for example the same data signaling and/or reference signaling. The beams may be transmitted by the same node and/or transmission point and/or antenna arrangement, or by different nodes and/or transmission points and/or antenna arrangements.

Communicating utilising a beam pair or a beam may comprise receiving signaling on a received beam (which may be a beam of a beam pair), and/or transmitting signaling on a beam, e.g. a beam of a beam pair. The following terms are to be interpreted from the point of view of the referred radio node: a received beam may be a beam carrying signaling received by the radio node (for reception, the radio node may use a reception beam, e.g. directed to the received beam, or be non-beamformed). A transmission beam may be a beam used by the radio node to transmit signaling. A beam pair may consist of a received beam and a transmission beam. The transmission beam and the received beam of a beam pair may be associated to each and/or correspond to each other, e.g. such that signaling on the received beam and signaling on a transmission beam travel essentially the same path (but in opposite directions), e.g. at least in a stationary or almost stationary condition. It should be noted that the terms "first" and "second" do not necessarily denote an order in time; a second signaling may be received and/or transmitted before, or in some cases simultaneous to, first signaling, or vice versa. The received beam and transmission beam of a beam pair may be on the same carrier or frequency range or bandwidth part, e.g. in a TDD operation; however, variants with FDD may be considered as well. Different beam pairs may operate on the same frequency ranges or carriers or bandwidth parts (e.g., such that transmission beams operate on the same frequency range or carriers or bandwidth part, and received beams on the same frequency range or carriers or bandwidth part (the transmission beam and received beams may be on the same or different ranges or carriers or BWPs). Communicating utilizing a first beam pair and/or first beam may be based on, and/or comprise, switching from the second beam pair or second beam to the first beam pair or first beam for communicating. The switching may be controlled by the network, for example a network node (which may be the source or transmitter of the received beam of the first beam pair and/or second beam pair, or be associated thereto, for example associated transmission points or nodes in dual connectivity). Such controlling may comprise transmitting control signaling, e.g. physical layer signaling and/or higher layer signaling. In some cases, the switching may be performed by the radio node without additional control signaling, for example based on measurements on signal quality and/or signal strength of beam pairs (e.g., of first and second received beams), in particular the first beam pair and/or the second beam pair. For example, it may be switched to the first beam pair (or first beam) if the signal quality or signal strength measured on the second beam pair (or second beam) is considered to be insufficient, and/or worse than corresponding measurements on the first beam pair indicate. Measurements performed on a beam pair (or beam) may in particular comprise measurements performed on a received beam of the beam pair. It may be considered that the timing indication may be determined before switching from the second beam pair to the first beam pair for communicating. Thus, the synchronization may be in place 8 and/or the timing indication may be available for synchronising) when starting communication utilizing the first beam pair or first beam. However, in some cases the timing indication may be determined after switching to the first beam pair or first beam. This may be in particular useful if first signaling is expected to be received after the switching only, for example based on a periodicity or scheduled timing of suitable reference signaling on the first beam pair, e.g. first received beam.

In some variants, reference signaling may be and/or comprise CSI-RS, e.g. transmitted by the network node. In other variants, the reference signaling may be transmitted by a UE, e.g. to a network node or other UE, in which case it may comprise and/or be Sounding Reference Signaling. Other, e.g. new, forms of reference signaling may be considered and/or used. In general, a modulation symbol of reference signaling respectively a resource element carrying it may be associated to a cyclic prefix.

Data signaling may be on a data channel, for example on a PDSCH or PSSCH, or on a dedicated data channel, e.g. for low latency and/or high reliability, e.g. a URLLC channel. Control signaling may be on a control channel, for example on a common control channel or a PDCCH or PSCCH, and/or comprise one or more DCI messages or SCI messages. Reference signaling may be associated to control signaling and/or data signaling, e.g. DM-RS and/or PT-RS.

Reference signaling, for example, may comprise DM-RS and/or pilot signaling and/or discovery signaling and/or synchronisation signaling and/or sounding signaling and/or phase tracking signaling and/or cell-specific reference signaling and/or user-specific signaling, in particular CSI-RS. Reference signaling in general may be signaling with one or more signaling characteristics, in particular transmission power and/or sequence of modulation symbols and/or resource distribution and/or phase distribution known to the receiver. Thus, the receiver can use the reference signaling as a reference and/or for training and/or for compensation. The receiver can be informed about the reference signaling by the transmitter, e.g. being configured and/or signaling with control signaling, in particular physical layer signaling and/or higher layer signaling (e.g., DCI and/or RRC signaling), and/or may determine the corresponding information itself, e.g. a network node configuring a UE to transmit reference signaling. Reference signaling may be signaling comprising one or more reference symbols and/or structures. Reference signaling may be adapted for gauging and/or estimating and/or representing transmission conditions, e.g. channel conditions and/or transmission path conditions and/or channel (or signal or transmission) quality. It may be considered that the transmission characteristics (e.g., signal strength and/or form and/or modulation and/or timing) of reference signaling are available for both transmitter and receiver of the signaling (e.g., due to being predefined and/or configured or configurable and/or being communicated). Different types of reference signaling may be considered, e.g. pertaining to uplink, downlink or sidelink, cell-specific (in particular, cell-wide, e.g., CRS) or device or user specific (addressed to a specific target or user equipment, e.g., CSI-RS), demodulation-related (e.g., DMRS) and/or signal strength related, e.g. power-related or energy-related or amplitude-related (e.g., SRS or pilot signaling) and/or phase-related, etc.

References to specific resource structures like an allocation unit and/or block symbol and/or block symbol group and/or transmission timing structure and/or symbol and/or slot and/or mini-slot and/or subcarrier and/or carrier may pertain to a specific numerology, which may be predefined and/or configured or configurable. A transmission timing structure may represent a time interval, which may cover one or more symbols. Some examples of a transmission timing structure are transmission time interval (TTI), subframe, slot and mini-slot. A slot may comprise a predetermined, e.g. predefined and/or configured or configurable, number of symbols, e.g. 6 or 7, or 12 or 14. A mini-slot may comprise a number of symbols (which may in particular be configurable or configured) smaller than the number of symbols of a slot, in particular 1, 2, 3 or 4, or more symbols, e.g. less symbols than symbols in a slot. A transmission timing structure may cover a time interval of a specific length, which may be dependent on symbol time length and/or cyclic prefix used. A transmission timing structure may pertain to, and/or cover, a specific time interval in a time stream, e.g. synchronized for communication. Timing structures used and/or scheduled for transmission, e.g. slot and/or mini-slots, may be scheduled in relation to, and/or synchronized to, a timing structure provided and/or defined by other transmission timing structures. Such transmission timing structures may define a timing grid, e.g., with symbol time intervals within individual structures representing the smallest timing units. Such a timing grid may for example be defined by slots or subframes (wherein in some cases, subframes may be considered specific variants of slots). A transmission timing structure may have a duration (length in time) determined based on the durations of its symbols, possibly in addition to cyclic prefix/es used. The symbols of a transmission timing structure may have the same duration, or may in some variants have different duration. The number of symbols in a transmission timing structure may be predefined and/or configured or configurable, and/or be dependent on numerology. The timing of a mini-slot may generally be configured or configurable, in particular by the network and/or a network node. The timing may be configurable to start and/or end at any symbol of the transmission timing structure, in particular one or more slots.

A transmission quality parameter may in general correspond to the number R of retransmissions and/or number T of total transmissions, and/or coding (e.g., number of coding bits, e.g. for error detection coding and/or error correction coding like FEC coding) and/or code rate and/or BLER and/or BER requirements and/or transmission power level (e.g., minimum level and/or target level and/or base power level P0 and/or transmission power control command, TPC, step size) and/or signal quality, e.g. SNR and/or SIR and/or SINR and/or power density and/or energy density.

A buffer state report (or buffer status report, BSR) may comprise information representing the presence and/or size of data to be transmitted (e.g., available in one or more buffers, for example provided by higher layers). The size may be indicated explicitly, and/or indexed to range/s of sizes, and/or may pertain to one or more different channel/s and/or acknowledgement processes and/or higher layers and/or channel groups/s, e.g., one or more logical channel/s and/or transport channel/s and/or groups thereof: The structure of a BSR may be predefined and/or configurable of configured, e.g. to override and/or amend a predefined structure, for example with higher layer signaling, e.g. RRC signaling. There may be different forms of BSR with different levels of resolution and/or information, e.g. a more detailed long BSR and a less detailed short BSR. A short BSR may concatenate and/or combine information of a long BSR, e.g. providing sums for data available for one or more channels and/or or channels groups and/or buffers, which might be represented individually in a long BSR; and/or may index a less-detailed range scheme for data available or buffered. A BSR may be used in lieu of a scheduling request, e.g. by a network node scheduling or allocating (uplink) resources for the transmitting radio node like a wireless device or UE or IAB node.

There is generally considered a program product comprising instructions adapted for causing processing and/or control circuitry to carry out and/or control any method described herein, in particular when executed on the processing and/or control circuitry. Also, there is considered a carrier medium arrangement carrying and/or storing a program product as described herein.

A carrier medium arrangement may comprise one or more carrier media. Generally, a carrier medium may be accessible and/or readable and/or receivable by processing or control circuitry. Storing data and/or a program product and/or code may be seen as part of carrying data and/or a program product and/or code. A carrier medium generally may comprise a guiding/transporting medium and/or a storage medium. A guiding/transporting medium may be adapted to carry and/or carry and/or store signals, in particular electromagnetic signals and/or electrical signals and/or magnetic signals and/or optical signals. A carrier medium, in particular a guiding/transporting medium, may be adapted to guide such signals to carry them. A carrier medium, in particular a guiding/transporting medium, may comprise the electromagnetic field, e.g. radio waves or microwaves, and/or optically transmissive material, e.g. glass fiber, and/or cable. A storage medium may comprise at least one of a memory, which may be volatile or non-volatile, a buffer, a cache, an optical disc, magnetic memory, flash memory, etc.

A system comprising one or more radio nodes as described herein, in particular a network node and a user equipment, is described. The system may be a wireless communication system, and/or provide and/or represent a radio access network.

Moreover, there may be generally considered a method of operating an information system, the method comprising providing information. Alternatively, or additionally, an information system adapted for providing information may be considered. Providing information may comprise providing information for, and/or to, a target system, which may comprise and/or be implemented as radio access network and/or a radio node, in particular a network node or user equipment or terminal. Providing information may comprise transferring and/or streaming and/or sending and/or passing on the information, and/or offering the information for such and/or for download, and/or triggering such providing, e.g. by triggering a different system or node to stream and/or transfer and/or send and/or pass on the information. The information system may comprise, and/or be connected or connectable to, a target, for example via one or more intermediate systems, e.g. a core network and/or internet and/or private or local network. Information may be provided utilising and/or via such intermediate system/s. Providing information may be for radio transmission and/or for transmission via an air interface and/or utilising a RAN or radio node as described herein. Connecting the information system to a target, and/or providing information, may be based on a target indication, and/or adaptive to a target indication. A target indication may indicate the target, and/or one or more parameters of transmission pertaining to the target and/or the paths or connections over which the information is provided to the target. Such parameter/s may in particular pertain to the air interface and/or radio access network and/or radio node and/or network node. Example parameters may indicate for example type and/or nature of the target, and/or transmission capacity (e.g., data rate) and/or latency and/or reliability and/or cost, respectively one or more estimates thereof. The target indication may be provided by the target, or determined by the information system, e.g. based on information received from the target and/or historical information, and/or be provided by a user, for example a user operating the target or a device in communication with the target, e.g. via the RAN and/or air interface. For example, a user may indicate on a user equipment communicating with the information system that information is to be provided via a RAN, e.g. by selecting from a selection provided by the information system, for example on a user application or user interface, which may be a web interface. An information system may comprise one or more information nodes. An information node may generally comprise processing circuitry and/or communication circuitry. In particular, an information system and/or an information node may be implemented as a computer and/or a computer arrangement, e.g. a host computer or host computer arrangement and/or server or server arrangement. In some variants, an interaction server (e.g., web server) of the information system may provide a user interface, and based on user input may trigger transmitting and/or streaming information provision to the user (and/or the target) from another server, which may be connected or connectable to the interaction server and/or be part of the information system or be connected or connectable thereto. The information may be any kind of data, in particular data intended for a user of for use at a terminal, e.g. video data and/or audio data and/or location data and/or interactive data and/or game-related data and/or environmental data and/or technical data and/or traffic data and/or vehicular data and/or circumstantial data and/or operational data. The information provided by the information system may be mapped to, and/or mappable to, and/or be intended for mapping to, communication or data signaling and/or one or more data channels as described herein (which may be signaling or channel/s of an air interface and/or used within a RAN and/or for radio transmission). It may be considered that the information is formatted based on the target indication and/or target, e.g. regarding data amount and/or data rate and/or data structure and/or timing, which in particular may be pertaining to a mapping to communication or data signaling and/or a data channel. Mapping information to data signaling and/or data channel/s may be considered to refer to using the signaling/channel/s to carry the data, e.g. on higher layers of communication, with the signaling/channel/s underlying the transmission. A target indication generally may comprise different components, which may have different sources, and/or which may indicate different characteristics of the target and/or communication path/s thereto. A format of information may be specifically selected, e.g. from a set of different formats, for information to be transmitted on an air interface and/or by a RAN as described herein. This may be particularly pertinent since an air interface may be limited in terms of capacity and/or of predictability, and/or potentially be cost sensitive. The format may be selected to be adapted to the transmission indication, which may in particular indicate that a RAN or radio node as described herein is in the path (which may be the indicated and/or planned and/or expected path) of information between the target and the information system. A (communication) path of information may represent the interface/s (e.g., air and/or cable interfaces) and/or the intermediate system/s (if any), between the information system and/or the node providing or transferring the information, and the target, over which the information is, or is to be, passed on. A path may be (at least partly) undetermined when a target indication is provided, and/or the information is provided/transferred by the information system, e.g. if an internet is involved, which may comprise multiple, dynamically chosen paths. Information and/or a format used for information may be packet-based, and/or be mapped, and/or be mappable and/or be intended for mapping, to packets. Alternatively, or additionally, there may be considered a method for operating a target device comprising providing a target indicating to an information system. More alternatively, or additionally, a target device may be considered, the target device being adapted for providing a target indication to an information system. In another approach, there may be considered a target indication tool adapted for, and/or comprising an indication module for, providing a target indication to an information system. The target device may generally be a target as described above. A target indication tool may comprise, and/or be implemented as, software and/or application or app, and/or web interface or user interface, and/or may comprise one or more modules for implementing actions performed and/or controlled by the tool. The tool and/or target device may be adapted for, and/or the method may comprise, receiving a user input, based on which a target indicating may be determined and/or provided. Alternatively, or additionally, the tool and/or target device may be adapted for, and/or the method may comprise, receiving information and/or communication signaling carrying information, and/or operating on, and/or presenting (e.g., on a screen and/or as audio or as other form of indication), information. The information may be based on received information and/or communication signaling carrying information. Presenting information may comprise processing received information, e.g. decoding and/or transforming, in particular between different formats, and/or for hardware used for presenting. Operating on information may be independent of or without presenting, and/or proceed or succeed presenting, and/or may be without user interaction or even user reception, for example for automatic processes, or target devices without (e.g., regular) user interaction like MTC devices, of for automotive or transport or industrial use. The information or communication signaling may be expected and/or received based on the target indication. Presenting and/or operating on information may generally comprise one or more processing steps, in particular decoding and/or executing and/or interpreting and/or transforming information. Operating on information may generally comprise relaying and/or transmitting the information, e.g. on an air interface, which may include mapping the information onto signaling (such mapping may generally pertain to one or more layers, e.g. one or more layers of an air interface, e.g. RLC (Radio Link Control) layer and/or MAC layer and/or physical layer/s). The information may be imprinted (or mapped) on communication signaling based on the target indication, which may make it particularly suitable for use in a RAN (e.g., for a target device like a network node or in particular a UE or terminal). The tool may generally be adapted for use on a target device, like a UE or terminal. Generally, the tool may provide multiple functionalities, e.g. for providing and/or selecting the target indication, and/or presenting, e.g. video and/or audio, and/or operating on and/or storing received information. Providing a target indication may comprise transmitting or transferring the indication as signaling, and/or carried on signaling, in a RAN, for example if the target device is a UE, or the tool for a UE. It should be noted that such provided information may be transferred to the information system via one or more additionally communication interfaces and/or paths and/or connections. The target indication may be a higher-layer indication and/or the information provided by the information system may be higher-layer information, e.g. application layer or user-layer, in particular above radio layers like transport layer and physical layer. The target indication may be mapped on physical layer radio signaling, e.g. related to or on the user-plane, and/or the information may be mapped on physical layer radio communication signaling, e.g. related to or on the user-plane (in particular, in reverse communication directions). The described approaches allow a target indication to be provided, facilitating information to be provided in a specific format particularly suitable and/or adapted to efficiently use an air interface. A user input may for example represent a selection from a plurality of possible transmission modes or formats, and/or paths, e.g. in terms of data rate and/or packaging and/or size of information to be provided by the information system.

In general, a numerology and/or subcarrier spacing may indicate the bandwidth (in frequency domain) of a subcarrier of a carrier, and/or the number of subcarriers in a carrier and/or the numbering of the subcarriers in a carrier, and/or the symbol time length. Different numerologies may in particular be different in the bandwidth of a subcarrier. In some variants, all the subcarriers in a carrier have the same bandwidth associated to them. The numerology and/or subcarrier spacing may be different between carriers in particular regarding the subcarrier bandwidth. A symbol time length, and/or a time length of a timing structure pertaining to a carrier may be dependent on the carrier frequency, and/or the subcarrier spacing and/or the numerology. In particular, different numerologies may have different symbol time lengths, even on the same carrier.

Signaling may generally comprise one or more (e.g., modulation) symbols and/or signals and/or messages. A signal may comprise or represent one or more bits. An indication may represent signaling, and/or be implemented as a signal, or as a plurality of signals. One or more signals may be included in and/or represented by a message. Signaling, in particular control signaling, may comprise a plurality of signals and/or messages, which may be transmitted on different carriers and/or be associated to different signaling processes, e.g. representing and/or pertaining to one or more such processes and/or corresponding information. An indication may comprise signaling, and/or a plurality of signals and/or messages and/or may be comprised therein, which may be transmitted on different carriers and/or be associated to different acknowledgement signaling processes, e.g. representing and/or pertaining to one or more such processes. Signaling associated to a channel may be transmitted such that represents signaling and/or information for that channel, and/or that the signaling is interpreted by the transmitter and/or receiver to belong to that channel. Such signaling may generally comply with transmission parameters and/or format/s for the channel.

An antenna arrangement may comprise one or more antenna elements (radiating elements), which may be combined in antenna arrays. An antenna array or subarray may comprise one antenna element, or a plurality of antenna elements, which may be arranged e.g. two dimensionally (for example, a panel) or three dimensionally. It may be considered that each antenna array or subarray or element is separately controllable, respectively that different antenna arrays are controllable separately from each other. A single antenna element/radiator may be considered the smallest example of a subarray. Examples of antenna arrays comprise one or more multi-antenna panels or one or more individually controllable antenna elements. An antenna arrangement may comprise a plurality of antenna arrays. It may be considered that an antenna arrangement is associated to a (specific and/or single) radio node, e.g. a configuring or informing or scheduling radio node, e.g. to be controlled or controllable by the radio node. An antenna arrangement associated to a UE or terminal may be smaller (e.g., in size and/or number of antenna elements or arrays) than the antenna arrangement associated to a network node. Antenna elements of an antenna arrangement may be configurable for different arrays, e.g. to change the beamforming characteristics. In particular, antenna arrays may be formed by combining one or more independently or separately controllable antenna elements or subarrays. The beams may be provided by analog beamforming, or in some variants by digital beamforming, or by hybrid beamforming combing analog and digital beamforming. The informing radio nodes may be configured with the manner of beam transmission, e.g. by transmitting a corresponding indicator or indication, for example as beam identify indication. However, there may be considered cases in which the informing radio node/s are not configured with such information, and/or operate transparently, not knowing the way of beamforming used. An antenna arrangement may be considered separately controllable in regard to the phase and/or amplitude/power and/or gain of a signal feed to it for transmission, and/or separately controllable antenna arrangements may comprise an independent or separate transmit and/or receive unit and/or ADC (Analog-Digital-Converter, alternatively an ADC chain) or DCA (Digital-to-Analog Converter, alternatively a DCA chain) to convert digital control information into an analog antenna feed for the whole antenna arrangement (the ADC/DCA may be considered part of, and/or connected or connectable to, antenna circuitry) or vice versa. A scenario in which an ADC or DCA is controlled directly for beamforming may be considered an analog beamforming scenario; such controlling may be performed after encoding/decoding and/or after modulation symbols have been mapped to resource elements. This may be on the level of antenna arrangements using the same ADC/DCA, e.g. one antenna element or a group of antenna elements associated to the same ADC/DCA. Digital beamforming may correspond to a scenario in which processing for beamforming is provided before feeding signaling to the ADC/DCA, e.g. by using one or more precoder/s and/or by precoding information, for example before and/or when mapping modulation symbols to resource elements. Such a precoder for beamforming may provide weights, e.g. for amplitude and/or phase, and/or may be based on a (precoder) codebook, e.g. selected from a codebook. A precoder may pertain to one beam or more beams, e.g. defining the beam or beams. The codebook may be configured or configurable, and/or be predefined. DFT beamforming may be considered a form of digital beamforming, wherein a DFT procedure is used to form one or more beams. Hybrid forms of beamforming may be considered.

A beam may be defined by a spatial and/or angular and/or spatial angular distribution of radiation and/or a spatial angle (also referred to as solid angle) or spatial (solid) angle distribution into which radiation is transmitted (for transmission beamforming) or from which it is received (for reception beamforming). Reception beamforming may comprise only accepting signals coming in from a reception beam (e.g., using analog beamforming to not receive outside reception beam/s), and/or sorting out signals that do not come in in a reception beam, e.g. in digital postprocessing, e.g. digital beamforming. A beam may have a solid angle equal to or smaller than 4*pi sr (4*pi correspond to a beam covering all directions), in particular smaller than 2*pi, or pi, or pi/2, or pi/4 or pi/8 or pi/16. In particular for high frequencies, smaller beams may be used. Different beams may have different directions and/or sizes (e.g., solid angle and/or reach). A beam may have a main direction, which may be defined by a main lobe (e.g., center of the main lobe, e.g. pertaining to signal strength and/or solid angle, which may be averaged and/or weighted to determine the direction), and may have one or more sidelobes. A lobe may generally be defined to have a continuous or contiguous distribution of energy and/or power transmitted and/or received, e.g. bounded by one or more contiguous or contiguous regions of zero energy (or practically zero energy). A main lobe may comprise the lobe with the largest signal strength and/or energy and/or power content. However, sidelobes usually appear due to limitations of beamforming, some of which may carry signals with significant strength, and may cause multi-path effects. A sidelobe may generally have a different direction than a main lobe and/or other side lobes, however, due to reflections a sidelobe still may contribute to transmitted and/or received energy or power. A beam may be swept and/or switched over time, e.g., such that its (main) direction is changed, but its shape (angular/solid angle distribution) around the main direction is not changed, e.g. from the transmitter's views for a transmission beam, or the receiver's view for a reception beam, respectively. Sweeping may correspond to continuous or near continuous change of main direction (e.g., such that after each change, the main lobe from before the change covers at least partly the main lobe after the change, e.g. at least to 50 or 75 or 90 percent). Switching may correspond to switching direction non-continuously, e.g. such that after each change, the main lobe from before the change does not cover the main lobe after the change, e.g. at most to 50 or 25 or 10 percent.

Signal strength may be a representation of signal power and/or signal energy, e.g. as seen from a transmitting node or a receiving node. A beam with larger strength at transmission (e.g., according to the beamforming used) than another beam does may not necessarily have larger strength at the receiver, and vice versa, for example due to interference and/or obstruction and/or dispersion and/or absorption and/or reflection and/or attrition or other effects influencing a beam or the signaling it carries. Signal quality may in general be a representation of how well a signal may be received over noise and/or interference. A beam with better signal quality than another beam does not necessarily have a larger beam strength than the other beam. Signal quality may be represented for example by SIR, SNR, SINR, BER, BLER, Energy per resource element over noise/interference or another corresponding quality measure. Signal quality and/or signal strength may pertain to, and/or may be measured with respect to, a beam, and/or specific signaling carried by the beam, e.g. reference signaling and/or a specific channel, e.g. a data channel or control channel. Signal strength may be represented by received signal strength, and/or relative signal strength, e.g. in comparison to a reference signal (strength).

Uplink or sidelink signaling may be OFDMA (Orthogonal Frequency Division Multiple Access) or SC-FDMA (Single Carrier Frequency Division Multiple Access) signaling. Downlink signaling may in particular be OFDMA signaling. However, signaling is not limited thereto (Filter-Bank based signaling and/or Single-Carrier based signaling, e.g. SC-FDE signaling, may be considered alternatives).

A radio node may generally be considered a device or node adapted for wireless and/or radio (and/or millimeter wave) frequency communication, and/or for communication utilising an air interface, e.g. according to a communication standard.

A radio node may be a network node, or a user equipment or terminal. A network node may be any radio node of a wireless communication network, e.g. a base station and/or gNodeB (gNB) and/or eNodeB (eNB) and/or relay node and/or micro/nano/pico/femto node and/or transmission point (TP) and/or access point (AP) and/or other node, in particular for a RAN or other wireless communication network as described herein.

The terms user equipment (UE) and terminal may be considered to be interchangeable in the context of this disclosure. A wireless device, user equipment or terminal may represent an end device for communication utilising the wireless communication network, and/or be implemented as a user equipment according to a standard. Examples of user equipments may comprise a phone like a smartphone, a personal communication device, a mobile phone or terminal, a computer, in particular laptop, a sensor or machine with radio capability (and/or adapted for the air interface), in particular for MTC (Machine-Type-Communication, sometimes also referred to M2M, Machine-To-Machine), or a vehicle adapted for wireless communication. A user equipment or terminal may be mobile or stationary. A wireless device generally may comprise, and/or be implemented as, processing circuitry and/or radio circuitry, which may comprise one or more chips or sets of chips. The circuitry and/or circuitries may be packaged, e.g. in a chip housing, and/or may have one or more physical interfaces to interact with other circuitry and/or for power supply. Such a wireless device may be intended for use in a user equipment or terminal.

A radio node may generally comprise processing circuitry and/or radio circuitry. A radio node, in particular a network node, may in some cases comprise cable circuitry and/or communication circuitry, with which it may be connected or connectable to another radio node and/or a core network.

Circuitry may comprise integrated circuitry. Processing circuitry may comprise one or more processors and/or controllers (e.g., microcontrollers), and/or ASICs (Application Specific Integrated Circuitry) and/or FPGAs (Field Programmable Gate Array), or similar. It may be considered that processing circuitry comprises, and/or is (operatively) connected or connectable to one or more memories or memory arrangements. A memory arrangement may comprise one or more memories. A memory may be adapted to store digital information. Examples for memories comprise volatile and non-volatile memory, and/or Random Access Memory (RAM), and/or Read-Only-Memory (ROM), and/or magnetic and/or optical memory, and/or flash memory, and/or hard disk memory, and/or EPROM or EEPROM (Erasable Programmable ROM or Electrically Erasable Programmable ROM).

Radio circuitry may comprise one or more transmitters and/or receivers and/or transceivers (a transceiver may operate or be operable as transmitter and receiver, and/or may comprise joint or separated circuitry for receiving and transmitting, e.g. in one package or housing), and/or may comprise one or more amplifiers and/or oscillators and/or filters, and/or may comprise, and/or be connected or connectable to antenna circuitry and/or one or more antennas and/or antenna arrays. An antenna array may comprise one or more antennas, which may be arranged in a dimensional array, e.g. 2D or 3D array, and/or antenna panels. A remote radio head (RRH) may be considered as an example of an antenna array. However, in some variants, an RRH may be also be implemented as a network node, depending on the kind of circuitry and/or functionality implemented therein.

Communication circuitry may comprise radio circuitry and/or cable circuitry. Communication circuitry generally may comprise one or more interfaces, which may be air interface/s and/or cable interface/s and/or optical interface/s, e.g. laser-based. Interface/s may be in particular packet-based. Cable circuitry and/or a cable interfaces may comprise, and/or be connected or connectable to, one or more cables (e.g., optical fiber-based and/or wire-based), which may be directly or indirectly (e.g., via one or more intermediate systems and/or interfaces) be connected or connectable to a target, e.g. controlled by communication circuitry and/or processing circuitry.

Any one or all of the modules disclosed herein may be implemented in software and/or firmware and/or hardware. Different modules may be associated to different components of a radio node, e.g. different circuitries or different parts of a circuitry. It may be considered that a module is distributed over different components and/or circuitries. A program product as described herein may comprise the modules related to a device on which the program product is intended (e.g., a user equipment or network node) to be executed (the execution may be performed on, and/or controlled by the associated circuitry).

A wireless communication network may be or comprise a radio access network and/or a backhaul network (e.g. a relay or backhaul network or an IAB network), and/or a Radio Access Network (RAN) in particular according to a communication standard. A communication standard may in particular a standard according to 3GPP and/or 5G, e.g. according to NR or LTE, in particular LTE Evolution.

A wireless communication network may be and/or comprise a Radio Access Network (RAN), which may be and/or comprise any kind of cellular and/or wireless radio network, which may be connected or connectable to a core network. The approaches described herein are particularly suitable for a 5G network, e.g. LTE Evolution and/or NR (New Radio), respectively successors thereof. A RAN may comprise one or more network nodes, and/or one or more terminals, and/or one or more radio nodes. A network node may in particular be a radio node adapted for radio and/or wireless and/or cellular communication with one or more terminals. A terminal may be any device adapted for radio and/or wireless and/or cellular communication with or within a RAN, e.g. a user equipment (UE) or mobile phone or smartphone or computing device or vehicular communication device or device for machine-type-communication (MTC), etc. A terminal may be mobile, or in some cases stationary. A RAN or a wireless communication network may comprise at least one network node and a UE, or at least two radio nodes. There may be generally considered a wireless communication network or system, e.g. a RAN or RAN system, comprising at least one radio node, and/or at least one network node and at least one terminal.

Transmitting in downlink may pertain to transmission from the network or network node to the terminal. Transmitting in uplink may pertain to transmission from the terminal to the network or network node. Transmitting in sidelink may pertain to (direct) transmission from one terminal to another. Uplink, downlink and sidelink (e.g., sidelink transmission and reception) may be considered communication directions. In some variants, uplink and downlink may also be used to described wireless communication between network nodes, e.g. for wireless backhaul and/or relay communication and/or (wireless) network communication for example between base stations or similar network nodes, in particular communication terminating at such. It may be considered that backhaul and/or relay communication and/or network communication is implemented as a form of sidelink or uplink communication or similar thereto.

Control information or a control information message or corresponding signaling (control signaling) may be transmitted on a control channel, e.g. a physical control channel, which may be a downlink channel or (or a sidelink channel in some cases, e.g. one UE scheduling another UE). For example, control information/allocation information may be signaled by a network node on PDCCH (Physical Downlink Control Channel) and/or a PDSCH (Physical Downlink Shared Channel) and/or a HARQ-specific channel. Acknowledgement signaling, e.g. as a form of control information or signaling like uplink control information/signaling, may be transmitted by a terminal on a PUCCH (Physical Uplink Control Channel) and/or PUSCH (Physical Uplink Shared Channel) and/or a HARQ-specific channel. Multiple channels may apply for multi-component/multi-carrier indication or signaling.

Transmitting acknowledgement signaling may in general be based on and/or in response to subject transmission, and/or to control signaling scheduling subject transmission. Such control signaling and/or subject signaling may be transmitted by a signaling radio node (which may be a network node, and/or a node associated to it, e.g. in a dual connectivity scenario. Subject transmission and/or subject signaling may be transmission or signaling to which ACK/NACK or acknowledgement information pertains, e.g. indicating correct or incorrect reception and/or decoding of the subject transmission or signaling. Subject signaling or transmission may in particular comprise and/or be represented by data signaling, e.g. on a PDSCH or PSSCH, or some forms of control signaling, e.g. on a PDCCH or PSSCH, for example for specific formats.

A signaling characteristic may be based on a type or format of a scheduling grant and/or scheduling assignment, and/or type of allocation, and/or timing of acknowledgement signaling and/or the scheduling grant and/or scheduling assignment, and/or resources associated to acknowledgement signaling and/or the scheduling grant and/or scheduling assignment. For example, if a specific format for a scheduling grant (scheduling or allocating the allocated resources) or scheduling assignment (scheduling the subject transmission for acknowledgement signaling) is used or detected, the first or second communication resource may be used. Type of allocation may pertain to dynamic allocation (e.g., using DCI/PDCCH) or semi-static allocation (e.g., for a configured grant). Timing of acknowledgement signaling may pertain to a slot and/or symbol/s the signaling is to be transmitted. Resources used for acknowledgement signaling may pertain to the allocated resources. Timing and/or resources associated to a scheduling grant or assignment may represent a search space or CORESET (a set of resources configured for reception of PDCCH transmissions) in which the grant or assignment is received. Thus, which transmission resource to be used may be based on implicit conditions, requiring low signaling overhead.

Scheduling may comprise indicating, e.g. with control signaling like DCI or SCI signaling and/or signaling on a control channel like PDCCH or PSCCH, one or more scheduling opportunities of a configuration intended to carry data signaling or subject signaling. The configuration may be represented or representable by, and/or correspond to, a table. A scheduling assignment may for example point to an opportunity of the reception allocation configuration, e.g. indexing a table of scheduling opportunities. In some cases, a reception allocation configuration may comprise 15 or 16 scheduling opportunities. The configuration may in particular represent allocation in time. It may be considered that the reception allocation configuration pertains to data signaling, in particular on a physical data channel like PDSCH or PSSCH. In general, the reception allocation configuration may pertain to downlink signaling, or in some scenarios to sidelink signaling. Control signaling scheduling subject transmission like data signaling may point and/or index and/or refer to and/or indicate a scheduling opportunity of the reception allocation configuration. It may be considered that the reception allocation configuration is configured or configurable with higher-layer signaling, e.g. RRC or MAC layer signaling. The reception allocation configuration may be applied and/or applicable and/or valid for a plurality of transmission timing intervals, e.g. such that for each interval, one or more opportunities may be indicated or allocated for data signaling. These approaches allow efficient and flexible scheduling, which may be semi-static, but may updated or reconfigured on useful timescales in response to changes of operation conditions.

Control information, e.g., in a control information message, in this context may in particular be implemented as and/or represented by a scheduling assignment, which may indicate subject transmission for feedback (transmission of acknowledgement signaling), and/or reporting timing and/or frequency resources and/or code resources. Reporting timing may indicate a timing for scheduled acknowledgement signaling, e.g. slot and/or symbol and/or resource set. Control information may be carried by control signaling.

Subject transmissions may comprise one or more individual transmissions. Scheduling assignments may comprise one or more scheduling assignments. It should generally be noted that in a distributed system, subject transmissions, configuration and/or scheduling may be provided by different nodes or devices or transmission points. Different subject transmissions may be on the same carrier or different carriers (e.g., in a carrier aggregation), and/or same or different bandwidth parts, and/or on the same or different layers or beams, e.g. in a MIMO scenario, and/or to same or different ports. Generally, subject transmissions may pertain to different HARQ or ARQ processes (or different sub-processes, e.g. in MIMO with different beams/layers associated to the same process identifier, but different sub-process-identifiers like swap bits). A scheduling assignment and/or a HARQ codebook may indicate a target HARQ structure. A target HARQ structure may for example indicate an intended HARQ response to a subject transmission, e.g. the number of bits and/or whether to provide code block group level response or not. However, it should be noted that the actual structure used may differ from the target structure, e.g. due to the total size of target structures for a subpattern being larger than the predetermined size.

Transmitting acknowledgement signaling, also referred to as transmitting acknowledgement information or feedback information or simply as ARQ or HARQ feedback or feedback or reporting feedback, may comprise, and/or be based on determining correct or incorrect reception of subject transmission/s, e.g. based on error coding and/or based on scheduling assignment/s scheduling the subject transmissions. Transmitting acknowledgement information may be based on, and/or comprise, a structure for acknowledgement information to transmit, e.g. the structure of one or more subpatterns, e.g. based on which subject transmission is scheduled for an associated subdivision. Transmitting acknowledgement information may comprise transmitting corresponding signaling, e.g. at one instance and/or in one message and/or one channel, in particular a physical channel, which may be a control channel. In some cases, the channel may be a shared channel or data channel, e.g. utilising rate-matching of the acknowledgement information. The acknowledgement information may generally pertain to a plurality of subject transmissions, which may be on different channels and/or carriers, and/or may comprise data signaling and/or control signaling. The acknowledgement information may be based on a codebook, which may be based on one or more size indications and/or assignment indications (representing HARQ structures), which may be received with a plurality of control signalings and/or control messages, e.g. in the same or different transmission timing structures, and/or in the same or different (target) sets of resources. Transmitting acknowledgement information may comprise determining the codebook, e.g. based on control information in one or more control information messages and/or a configuration. A codebook may pertain to transmitting acknowledgement information at a single and/or specific instant, e.g. a single PUCCH or PUSCH transmission, and/or in one message or with jointly encoded and/or modulated acknowledgement information. Generally, acknowledgement information may be transmitted together with other control information, e.g. a scheduling request and/or measurement information.

Acknowledgement signaling may in some cases comprise, next to acknowledgement information, other information, e.g. control information, in particular, uplink or sidelink control information, like a scheduling request and/or measurement information, or similar, and/or error detection and/or correction information, respectively associated bits. The payload size of acknowledgement signaling may represent the number of bits of acknowledgement information, and/or in some cases the total number of bits carried by the acknowledgement signaling, and/or the number of resource elements needed. Acknowledgement signaling and/or information may pertain to ARQ and/or HARQ processes; an ARQ process may provide ACK/NACK (and perhaps additional feedback) feedback, and decoding may be performed on each (re-)transmission separately, without soft-buffering/soft-combining intermediate data, whereas HARQ may comprise soft-buffering/soft-combining of intermediate data of decoding for one or more (re-)transmissions.

Subject transmission may be data signaling or control signaling. The transmission may be on a shared or dedicated channel. Data signaling may be on a data channel, for example on a PDSCH or PSSCH, or on a dedicated data channel, e.g. for low latency and/or high reliability, e.g. a URLLC channel. Control signaling may be on a control channel, for example on a common control channel or a PDCCH or PSCCH, and/or comprise one or more DCI messages or SCI messages. In some cases, the subject transmission may comprise, or represent, reference signaling. For example, it may comprise DM-RS and/or pilot signaling and/or discovery signaling and/or sounding signaling and/or phase tracking signaling and/or cell-specific reference signaling and/or user-specific signaling, in particular CSI-RS. A subject transmission may pertain to one scheduling assignment and/or one acknowledgement signaling process (e.g., according to identifier or subidentifier), and/or one subdivision. In some cases, a subject transmission may cross the borders of subdivisions in time, e.g. due to being scheduled to start in one subdivision and extending into another, or even crossing over more than one subdivision. In this case, it may be considered that the subject transmission is associated to the subdivision it ends in.

It may be considered that transmitting acknowledgement information, in particular of acknowledgement information, is based on determining whether the subject transmission/s has or have been received correctly, e.g. based on error coding and/or reception quality. Reception quality may for example be based on a determined signal quality. Acknowledgement information may generally be transmitted to a signaling radio node and/or node arrangement and/or to a network and/or network node.

Acknowledgement information, or bit/s of a subpattern structure of such information (e.g., an acknowledgement information structure, may represent and/or comprise one or more bits, in particular a pattern of bits. Multiple bits pertaining to a data structure or substructure or message like a control message may be considered a subpattern. The structure or arrangement of acknowledgement information may indicate the order, and/or meaning, and/or mapping, and/or pattern of bits (or subpatterns of bits) of the information. The structure or mapping may in particular indicate one or more data block structures, e.g. code blocks and/or code block groups and/or transport blocks and/or messages, e.g. command messages, the acknowledgement information pertains to, and/or which bits or subpattern of bits are associated to which data block structure. In some cases, the mapping may pertain to one or more acknowledgement signaling processes, e.g. processes with different identifiers, and/or one or more different data streams. The configuration or structure or codebook may indicate to which process/es and/or data stream/s the information pertains. Generally, the acknowledgement information may comprise one or more subpatterns, each of which may pertain to a data block structure, e.g. a code block or code block group or transport block. A subpattern may be arranged to indicate acknowledgement or non-acknowledgement, or another retransmission state like non-scheduling or non-reception, of the associated data block structure. It may be considered that a subpattern comprises one bit, or in some cases more than one bit. It should be noted that acknowledgement information may be subjected to significant processing before being transmitted with acknowledgement signaling. Different configurations may indicate different sizes and/or mapping and/or structures and/or pattern.

An acknowledgement signaling process (providing acknowledgement information) may be a HARQ process, and/or be identified by a process identifier, e.g. a HARQ process identifier or subidentifier. Acknowledgement signaling and/or associated acknowledgement information may be referred to as feedback or acknowledgement feedback. It should be noted that data blocks or structures to which subpatterns may pertain may be intended to carry data (e.g., information and/or systemic and/or coding bits). However, depending on transmission conditions, such data may be received or not received (or not received correctly), which may be indicated correspondingly in the feedback. In some cases, a subpattern of acknowledgement signaling may comprise padding bits, e.g. if the acknowledgement information for a data block requires fewer bits than indicated as size of the subpattern. Such may for example happen if the size is indicated by a unit size larger than required for the feedback.

Acknowledgement information may generally indicate at least ACK or NACK, e.g. pertaining to an acknowledgement signaling process, or an element of a data block structure like a data block, subblock group or subblock, or a message, in particular a control message. Generally, to an acknowledgement signaling process there may be associated one specific subpattern and/or a data block structure, for which acknowledgement information may be provided. Acknowledgement information may comprise a plurality of pieces of information, represented in a plurality of ARQ and/or HARQ structures.

An acknowledgement signaling process may determine correct or incorrect reception, and/or corresponding acknowledgement information, of a data block like a transport block, and/or substructures thereof, based on coding bits associated to the data block, and/or based on coding bits associated to one or more data block and/or subblocks and/or subblock group/s. Acknowledgement information (determined by an acknowledgement signaling process) may pertain to the data block as a whole, and/or to one or more subblocks or subblock groups. A code block may be considered an example of a subblock, whereas a code block group may be considered an example of a subblock group. Accordingly, the associated subpattern may comprise one or more bits indicating reception status or feedback of the data block, and/or one or more bits indicating reception status or feedback of one or more subblocks or subblock groups. Each subpattern or bit of the subpattern may be associated and/or mapped to a specific data block or subblock or subblock group. In some variants, correct reception for a data block may be indicated if all subblocks or subblock groups are correctly identified. In such a case, the subpattern may represent acknowledgement information for the data block as a whole, reducing overhead in comparison to provide acknowledgement information for the subblocks or subblock groups. The smallest structure (e.g. subblock/subblock group/data block) the subpattern provides acknowledgement information for and/or is associated to may be considered its (highest) resolution. In some variants, a subpattern may provide acknowledgement information regarding several elements of a data block structure and/or at different resolution, e.g. to allow more specific error detection. For example, even if a subpattern indicates acknowledgement signaling pertaining to a data block as a whole, in some variants higher resolution (e.g., subblock or subblock group resolution) may be provided by the subpattern. A subpattern may generally comprise one or more bits indicating ACK/NACK for a data block, and/or one or more bits for indicating ACK/NACK for a subblock or subblock group, or for more than one subblock or subblock group.

A subblock and/or subblock group may comprise information bits (representing the data to be transmitted, e.g. user data and/or downlink/sidelink data or uplink data). It may be considered that a data block and/or subblock and/or subblock group also comprises error one or more error detection bits, which may pertain to, and/or be determined based on, the information bits (for a subblock group, the error detection bit/s may be determined based on the information bits and/or error detection bits and/or error correction bits of the subblock/s of the subblock group). A data block or substructure like subblock or subblock group may comprise error correction bits, which may in particular be determined based on the information bits and error detection bits of the block or substructure, e.g. utilising an error correction coding scheme, in particular for forward error correction (FEC), e.g. LDPC or polar coding and/or turbo coding. Generally, the error correction coding of a data block structure (and/or associated bits) may cover and/or pertain to information bits and error detection bits of the structure. A subblock group may represent a combination of one or more code blocks, respectively the corresponding bits. A data block may represent a code block or code block group, or a combination of more than one code block groups. A transport block may be split up in code blocks and/or code block groups, for example based on the bit size of the information bits of a higher layer data structure provided for error coding and/or size requirements or preferences for error coding, in particular error correction coding. Such a higher layer data structure is sometimes also referred to as transport block, which in this context represents information bits without the error coding bits described herein, although higher layer error handling information may be included, e.g. for an internet protocol like TCP. However, such error handling information represents information bits in the context of this disclosure, as the acknowledgement signaling procedures described treat it accordingly.

In some variants, a subblock like a code block may comprise error correction bits, which may be determined based on the information bit/s and/or error detection bit/s of the subblock. An error correction coding scheme may be used for determining the error correction bits, e.g. based on LDPC or polar coding or Reed-Mueller coding. In some cases, a subblock or code block may be considered to be defined as a block or pattern of bits comprising information bits, error detection bit/s determined based on the information bits, and error correction bit/s determined based on the information bits and/or error detection bit/s. It may be considered that in a subblock, e.g. code block, the information bits (and possibly the error correction bit/s) are protected and/or covered by the error correction scheme or corresponding error correction bit/s. A code block group may comprise one or more code blocks. In some variants, no additional error detection bits and/or error correction bits are applied, however, it may be considered to apply either or both. A transport block may comprise one or more code block groups. It may be considered that no additional error detection bits and/or error correction bits are applied to a transport block, however, it may be considered to apply either or both. In some specific variants, the code block group/s comprise no additional layers of error detection or correction coding, and the transport block may comprise only additional error detection coding bits, but no additional error correction coding. This may particularly be true if the transport block size is larger than the code block size and/or the maximum size for error correction coding. A subpattern of acknowledgement signaling (in particular indicating ACK or NACK) may pertain to a code block, e.g. indicating whether the code block has been correctly received. It may be considered that a subpattern pertains to a subgroup like a code block group or a data block like a transport block. In such cases, it may indicate ACK, if all subblocks or code blocks of the group or data/transport block are received correctly (e.g. based on a logical AND operation), and NACK or another state of non-correct reception if at least one subblock or code block has not been correctly received. It should be noted that a code block may be considered to be correctly received not only if it actually has been correctly received, but also if it can be correctly reconstructed based on soft-combining and/or the error correction coding.

A subpattern/HARQ structure may pertain to one acknowledgement signaling process and/or one carrier like a component carrier and/or data block structure or data block. It may in particular be considered that one (e.g. specific and/or single) subpattern pertains, e.g. is mapped by the codebook, to one (e.g., specific and/or single) acknowledgement signaling process, e.g. a specific and/or single HARQ process. It may be considered that in the bit pattern, subpatterns are mapped to acknowledgement signaling processes and/or data blocks or data block structures on a one-to-one basis. In some variants, there may be multiple subpatterns (and/or associated acknowledgement signaling processes) associated to the same component carrier, e.g. if multiple data streams transmitted on the carrier are subject to acknowledgement signaling processes. A subpattern may comprise one or more bits, the number of which may be considered to represent its size or bit size. Different bit n-tuples (n being 1 or larger) of a subpattern may be associated to different elements of a data block structure (e.g., data block or subblock or subblock group), and/or represent different resolutions. There may be considered variants in which only one resolution is represented by a bit pattern, e.g. a data block. A bit n-tuple may represent acknowledgement information (also referred to a feedback), in particular ACK or NACK, and optionally, (if n>1), may represent DTX/DRX or other reception states. ACK/NACK may be represented by one bit, or by more than one bit, e.g. to improve disambiguity of bit sequences representing ACK or NACK, and/or to improve transmission reliability.

The acknowledgement information or feedback information may pertain to a plurality of different transmissions, which may be associated to and/or represented by data block structures, respectively the associated data blocks or data signaling. The data block structures, and/or the corresponding blocks and/or signaling, may be scheduled for simultaneous transmission, e.g. for the same transmission timing structure, in particular within the same slot or subframe, and/or on the same symbol/s. However, alternatives with scheduling for non-simultaneous transmission may be considered. For example, the acknowledgement information may pertain to data blocks scheduled for different transmission timing structures, e.g. different slots (or mini-slots, or slots and mini-slots) or similar, which may correspondingly be received (or not or wrongly received). Scheduling signaling may generally comprise indicating resources, e.g. time and/or frequency resources, for example for receiving or transmitting the scheduled signaling.

Signaling may generally be considered to represent an electromagnetic wave structure (e.g., over a time interval and frequency interval), which is intended to convey information to at least one specific or generic (e.g., anyone who might pick up the signaling) target. A process of signaling may comprise transmitting the signaling. Transmitting signaling, in particular control signaling or communication signaling, e.g. comprising or representing acknowledgement signaling and/or resource requesting information, may comprise encoding and/or modulating. Encoding and/or modulating may comprise error detection coding and/or forward error correction encoding and/or scrambling. Receiving control signaling may comprise corresponding decoding and/or demodulation. Error detection coding may comprise, and/or be based on, parity or checksum approaches, e.g. CRC (Cyclic Redundancy Check). Forward error correction coding may comprise and/or be based on for example turbo coding and/or Reed-Muller coding, and/or polar coding and/or LDPC coding (Low Density Parity Check). The type of coding used may be based on the channel (e.g., physical channel) the coded signal is associated to. A code rate may represent the ratio of the number of information bits before encoding to the number of encoded bits after encoding, considering that encoding adds coding bits for error detection coding and forward error correction. Coded bits may refer to information bits (also called systematic bits) plus coding bits.

Communication signaling may comprise, and/or represent, and/or be implemented as, data signaling, and/or user plane signaling. Communication signaling may be associated to a data channel, e.g. a physical downlink channel or physical uplink channel or physical sidelink channel, in particular a PDSCH (Physical Downlink Shared Channel) or PSSCH (Physical Sidelink Shared Channel). Generally, a data channel may be a shared channel or a dedicated channel. Data signaling may be signaling associated to and/or on a data channel.

An indication generally may explicitly and/or implicitly indicate the information it represents and/or indicates. Implicit indication may for example be based on position and/or resource used for transmission. Explicit indication may for example be based on a parametrisation with one or more parameters, and/or one or more index or indices, and/or one or more bit patterns representing the information. It may in particular be considered that control signaling as described herein, based on the utilised resource sequence, implicitly indicates the control signaling type.

A resource element may generally describe the smallest individually usable and/or encodable and/or decodable and/or modulatable and/or demodulatable time-frequency resource, and/or may describe a time-frequency resource covering a symbol time length in time and a subcarrier in frequency. A signal may be allocatable and/or allocated to a resource element. A subcarrier may be a subband of a carrier, e.g. as defined by a standard. A carrier may define a frequency and/or frequency band for transmission and/or reception. In some variants, a signal (jointly encoded/modulated) may cover more than one resource elements. A resource element may generally be as defined by a corresponding standard, e.g. NR or LTE. As symbol time length and/or subcarrier spacing (and/or numerology) may be different between different symbols and/or subcarriers, different resource elements may have different extension (length/width) in time and/or frequency domain, in particular resource elements pertaining to different carriers.

A resource generally may represent a time-frequency and/or code resource, on which signaling, e.g. according to a specific format, may be communicated, for example transmitted and/or received, and/or be intended for transmission and/or reception.

A border symbol (or allocation unit) may generally represent a starting symbol (allocation unit) or an ending symbol (allocation unit) for transmitting and/or receiving. A starting symbol (or allocation unit) may in particular be a starting symbol of uplink or sidelink signaling, for example control signaling or data signaling. Such signaling may be on a data channel or control channel, e.g. a physical channel, in particular a physical uplink shared channel (like PUSCH) or a sidelink data or shared channel, or a physical uplink control channel (like PUCCH) or a sidelink control channel. If the starting symbol (or allocation unit) is associated to control signaling (e.g., on a control channel), the control signaling may be in response to received signaling (in sidelink or downlink), e.g. representing acknowledgement signaling associated thereto, which may be HARQ or ARQ signaling. An ending symbol (or allocation unit) may represent an ending symbol (in time) of downlink or sidelink transmission or signaling, which may be intended or scheduled for the radio node or user equipment. Such downlink signaling may in particular be data signaling, e.g. on a physical downlink channel like a shared channel, e.g. a PDSCH (Physical Downlink Shared Channel). A starting symbol (or allocation unit) may be determined based on, and/or in relation to, such an ending symbol (or allocation unit).

Configuring a radio node, in particular a terminal or user equipment, may refer to the radio node being adapted or caused or set and/or instructed to operate according to the configuration. Configuring may be done by another device, e.g., a network node (for example, a radio node of the network like a base station or eNodeB) or network, in which case it may comprise transmitting configuration data to the radio node to be configured. Such configuration data may represent the configuration to be configured and/or comprise one or more instruction pertaining to a configuration, e.g. a configuration for transmitting and/or receiving on allocated resources, in particular frequency resources. A radio node may configure itself, e.g., based on configuration data received from a network or network node. A network node may utilise, and/or be adapted to utilise, its circuitry/ies for configuring. Allocation information may be considered a form of configuration data. Configuration data may comprise and/or be represented by configuration information, and/or one or more corresponding indications and/or message/s Generally, configuring may include determining configuration data representing the configuration and providing, e.g. transmitting, it to one or more other nodes (parallel and/or sequentially), which may transmit it further to the radio node (or another node, which may be repeated until it reaches the wireless device). Alternatively, or additionally, configuring a radio node, e.g., by a network node or other device, may include receiving configuration data and/or data pertaining to configuration data, e.g., from another node like a network node, which may be a higher-level node of the network, and/or transmitting received configuration data to the radio node. Accordingly, determining a configuration and transmitting the configuration data to the radio node may be performed by different network nodes or entities, which may be able to communicate via a suitable interface, e.g., an X2 interface in the case of LTE or a corresponding interface for NR. Configuring a terminal may comprise scheduling downlink and/or uplink transmissions for the terminal, e.g. downlink data and/or downlink control signaling and/or DCI and/or uplink control or data or communication signaling, in particular acknowledgement signaling, and/or configuring resources and/or a resource pool therefor.

A resource structure may be considered to be neighbored in frequency domain by another resource structure, if they share a common border frequency, e.g. one as an upper frequency border and the other as a lower frequency border. Such a border may for example be represented by the upper end of a bandwidth assigned to a subcarrier n, which also represents the lower end of a bandwidth assigned to a subcarrier n+1. A resource structure may be considered to be neighbored in time domain by another resource structure, if they share a common border time, e.g. one as an upper (or right in the figures) border and the other as a lower (or left in the figures) border. Such a border may for example be represented by the end of the symbol time interval assigned to a symbol n, which also represents the beginning of a symbol time interval assigned to a symbol n+1.

Generally, a resource structure being neighbored by another resource structure in a domain may also be referred to as abutting and/or bordering the other resource structure in the domain.

A resource structure may in general represent a structure in time and/or frequency domain, in particular representing a time interval and a frequency interval. A resource structure may comprise and/or be comprised of resource elements, and/or the time interval of a resource structure may comprise and/or be comprised of symbol time interval/s, and/or the frequency interval of a resource structure may comprise and/or be comprised of subcarrier/s. A resource element may be considered an example for a resource structure, a slot or mini-slot or a Physical Resource Block (PRB) or parts thereof may be considered others. A resource structure may be associated to a specific channel, e.g. a PUSCH or PUCCH, in particular resource structure smaller than a slot or PRB.

Examples of a resource structure in frequency domain comprise a bandwidth or band, or a bandwidth part. A bandwidth part may be a part of a bandwidth available for a radio node for communicating, e.g. due to circuitry and/or configuration and/or regulations and/or a standard. A bandwidth part may be configured or configurable to a radio node. In some variants, a bandwidth part may be the part of a bandwidth used for communicating, e.g. transmitting and/or receiving, by a radio node. The bandwidth part may be smaller than the bandwidth (which may be a device bandwidth defined by the circuitry/configuration of a device, and/or a system bandwidth, e.g. available for a RAN). It may be considered that a bandwidth part comprises one or more resource blocks or resource block groups, in particular one or more PRBs or PRB groups. A bandwidth part may pertain to, and/or comprise, one or more carriers. A resource structure may in time domain comprise and/or represent a time interval, e.g. one of more allocation units and/or symbols and/or slots and/or subframes. In general, any reference to a symbol as a time interval may be considered as a reference to an allocation unit as a more general term, unless the reference to the symbol is specific, e.g. referring to a specific division or modulation technique, or to modulation symbols as transmission structures.

A carrier may generally represent a frequency range or band and/or pertain to a central frequency and an associated frequency interval. It may be considered that a carrier comprises a plurality of subcarriers. A carrier may have assigned to it a central frequency or center frequency interval, e.g. represented by one or more subcarriers (to each subcarrier there may be generally assigned a frequency bandwidth or interval). Different carriers may be non-overlapping, and/or may be neighboring in frequency domain.

It should be noted that the term "radio" in this disclosure may be considered to pertain to wireless communication in general, and may also include wireless communication utilising millimeter waves, in particular above one of the thresholds 10 GHz or 20 GHz or 50 GHz or 52 GHz or 52.6 GHz or 60 GHz or 72 GHz or 100 GHz or 114 GHz. Such communication may utilise one or more carriers, e.g. in FDD and/or carrier aggregation. Upper frequency boundaries may correspond to 300 GHz or 200 GHz or 120 GHz or any of the thresholds larger than the one representing the lower frequency boundary.

A radio node, in particular a network node or a terminal, may generally be any device adapted for transmitting and/or receiving radio and/or wireless signals and/or data, in particular communication data, in particular on at least one carrier. The at least one carrier may comprise a carrier accessed based on an LBT procedure (which may be called LBT carrier), e.g., an unlicensed carrier. It may be considered that the carrier is part of a carrier aggregate.

Receiving or transmitting on a cell or carrier may refer to receiving or transmitting utilizing a frequency (band) or spectrum associated to the cell or carrier. A cell may generally comprise and/or be defined by or for one or more carriers, in particular at least one carrier for UL communication/transmission (called UL carrier) and at least one carrier for DL communication/transmission (called DL carrier). It may be considered that a cell comprises different numbers of UL carriers and DL carriers. Alternatively, or additionally, a cell may comprise at least one carrier for UL communication/transmission and DL communication/transmission, e.g., in TDD-based approaches.

A channel may generally be a logical, transport or physical channel. A channel may comprise and/or be arranged on one or more carriers, in particular a plurality of subcarriers. A channel carrying and/or for carrying control signaling/control information may be considered a control channel, in particular if it is a physical layer channel and/or if it carries control plane information. Analogously, a channel carrying and/or for carrying data signaling/user information may be considered a data channel, in particular if it is a physical layer channel and/or if it carries user plane information. A channel may be defined for a specific communication direction, or for two complementary communication directions (e.g., UL and DL, or sidelink in two directions), in which case it may be considered to have two component channels, one for each direction. Examples of channels comprise a channel for low latency and/or high reliability transmission, in particular a channel for Ultra-Reliable Low Latency Communication (URLLC), which may be for control and/or data.

A control region generally may comprise time and/or frequency domain resources. A control region may be intended and/or indicated and/or configured, e.g. with higher layer signaling, for transmission of control signaling, in particular first control signaling. A control region may be periodic or aperiodic; in some cases, it may repeat at certain time intervals (e.g., within a larger time interval) or be set or triggered or indicated for limited usage, e.g. in general in relation to a timing structure like a frame structure associated to the wireless communication network and/or used therein. A control region may be represented by a CORESET or a resource set in time and/or frequency domain. To a control region, there may be associated a search space. The search space may contain and/or be based on the control region. In this disclosure, features associated to a control region may be associated to the associated search space and vice versa. A search space may provide parameters and/or features associated to control signaling to be expected and/or processed and/or received and/or transmitted on resource of the control region, e.g. one or more signaling characteristics of control signaling associated to the search space, e.g. type of control signaling (e.g., format) and/or allowable aggregation level and/or possible location in the control region. It should be noted that the control region may be shifted in time domain from the perspective of the transmitter and receiver, e.g. due to delay effects and/or travel time of signaling. However, the same term will be used for both perspectives, as there will be an unambiguous association; in particular, the transmitter will intend reception in the control region of the receiver. A control region and/or search space may be configured by a network, e.g. a transmitting radio node, e.g. with higher layer signaling and/or broadcast signaling. A search space may be device-specific (e.g., configured specifically for one device, and/or with unicast signaling) or a common search space, e.g. configured with multicast and/or broadcast signaling. A control region may span one or more block symbols and/or allocation units and/or have an extension in frequency domain corresponding to a control region bandwidth and/or a plurality of subcarriers or resource blocks, e.g. physical and/or virtual resource blocks. It should be noted that control signaling of the set of control signalings may comprise control signaling that may occupy time/frequency resource/s (e.g., a set of resources) included in the control region and/or search space, but do not necessarily have to use all resources of the control region and/or search space. In general, the control region and/or search space may represent resources (e.g., a set of time/frequency resources) a receiver may monitor and/or search for control signaling, e.g. control signaling addressed to and/or intended for the receiver. Parameters and/or characteristics of the search space may limit and/or define the monitoring in more detail.

In general, a symbol or allocation unit may represent and/or be associated to a symbol time length (or unit time length), which may be dependent on the carrier and/or subcarrier spacing and/or numerology of the associated carrier. Accordingly, a symbol may be considered to indicate a time interval having a symbol time length in relation to frequency domain. A symbol time length may be dependent on a carrier frequency and/or bandwidth and/or numerology and/or subcarrier spacing of, or associated to, a symbol. Accordingly, different symbols may have different symbol time lengths. In particular, numerologies with different subcarrier spacings may have different symbol time length. Generally, a symbol time length may be based on, and/or include, a guard time interval or cyclic extension, e.g. prefix or postfix.

A sidelink may generally represent a communication channel (or channel structure) between two UEs and/or terminals, in which data is transmitted between the participants (UEs and/or terminals) via the communication channel, e.g. directly and/or without being relayed via a network node. A sidelink may be established only and/or directly via air interface/s of the participant, which may be directly linked via the sidelink communication channel. In some variants, sidelink communication may be performed without interaction by a network node, e.g. on fixedly defined resources and/or on resources negotiated between the participants. Alternatively, or additionally, it may be considered that a network node provides some control functionality, e.g. by configuring resources, in particular one or more resource pool/s, for sidelink communication, and/or monitoring a sidelink, e.g. for charging purposes.

Sidelink communication may also be referred to as device-to-device (D2D) communication, and/or in some cases as ProSe (Proximity Services) communication, e.g. in the context of LTE. A sidelink may be implemented in the context of V2x communication (Vehicular communication), e.g. V2V (Vehicle-to-Vehicle), V2I (Vehicle-to-Infrastructure) and/or V2P (Vehicle-to-Person). Any device adapted for sidelink communication may be considered a user equipment or terminal.

A sidelink communication channel (or structure) may comprise one or more (e.g., physical or logical) channels, e.g. a PSCCH (Physical Sidelink Control CHannel, which may for example carry control information like an acknowledgement position indication, and/or a PSSCH (Physical Sidelink Shared CHannel, which for example may carry data and/or acknowledgement signaling). It may be considered that a sidelink communication channel (or structure) pertains to and/or used one or more carrier/s and/or frequency range/s associated to, and/or being used by, cellular communication, e.g. according to a specific license and/or standard. Participants may share a (physical) channel and/or resources, in particular in frequency domain and/or related to a frequency resource like a carrier) of a sidelink, such that two or more participants transmit thereon, e.g. simultaneously, and/or time-shifted, and/or there may be associated specific channels and/or resources to specific participants, so that for example only one participant transmits on a specific channel or on a specific resource or specific resources, e.g., in frequency domain and/or related to one or more carriers or subcarriers.

A sidelink may comply with, and/or be implemented according to, a specific standard, e.g. an LTE-based standard and/or NR. A sidelink may utilise TDD (Time Division Duplex) and/or FDD (Frequency Division Duplex) technology, e.g. as configured by a network node, and/or preconfigured and/or negotiated between the participants. A user equipment may be considered to be adapted for sidelink communication if it, and/or its radio circuitry and/or processing circuitry, is adapted for utilising a sidelink, e.g. on one or more frequency ranges and/or carriers and/or in one or more formats, in particular according to a specific standard. It may be generally considered that a Radio Access Network is defined by two participants of a sidelink communication. Alternatively, or additionally, a Radio Access Network may be represented, and/or defined with, and/or be related to a network node and/or communication with such a node.

Communication or communicating may generally comprise transmitting and/or receiving signaling. Communication on a sidelink (or sidelink signaling) may comprise utilising the sidelink for communication (respectively, for signaling). Sidelink transmission and/or transmitting on a sidelink may be considered to comprise transmission utilising the sidelink, e.g. associated resources and/or transmission formats and/or circuitry and/or the air interface. Sidelink reception and/or receiving on a sidelink may be considered to comprise reception utilising the sidelink, e.g. associated resources and/or transmission formats and/or circuitry and/or the air interface. Sidelink control information (e.g., SCI) may generally be considered to comprise control information transmitted utilising a sidelink.

Generally, carrier aggregation (CA) may refer to the concept of a radio connection and/or communication link between a wireless and/or cellular communication network and/or network node and a terminal or on a sidelink comprising a plurality of carriers for at least one direction of transmission (e.g. DL and/or UL), as well as to the aggregate of carriers. A corresponding communication link may be referred to as carrier aggregated communication link or CA communication link; carriers in a carrier aggregate may be referred to as component carriers (CC). In such a link, data may be transmitted over more than one of the carriers and/or all the carriers of the carrier aggregation (the aggregate of carriers). A carrier aggregation may comprise one (or more) dedicated control carriers and/or primary carriers (which may e.g. be referred to as primary component carrier or PCC), over which control information may be transmitted, wherein the control information may refer to the primary carrier and other carriers, which may be referred to as secondary carriers (or secondary component carrier, SCC). However, in some approaches, control information may be sent over more than one carrier of an aggregate, e.g. one or more PCCs and one PCC and one or more SCCs.

A transmission may generally pertain to a specific channel and/or specific resources, in particular with a starting symbol and ending symbol in time, covering the interval therebetween. A scheduled transmission may be a transmission scheduled and/or expected and/or for which resources are scheduled or provided or reserved. However, not every scheduled transmission has to be realized. For example, a scheduled downlink transmission may not be received, or a scheduled uplink transmission may not be transmitted due to power limitations, or other influences (e.g., a channel on an unlicensed carrier being occupied). A transmission may be scheduled for a transmission timing substructure (e.g., a mini-slot, and/or covering only a part of a transmission timing structure) within a transmission timing structure like a slot. A border symbol may be indicative of a symbol in the transmission timing structure at which the transmission starts or ends.

Predefined in the context of this disclosure may refer to the related information being defined for example in a standard, and/or being available without specific configuration from a network or network node, e.g. stored in memory, for example independent of being configured. Configured or configurable may be considered to pertain to the corresponding information being set/configured, e.g. by the network or a network node.

A configuration or schedule, like a mini-slot configuration and/or structure configuration, may schedule transmissions, e.g. for the time/transmissions it is valid, and/or transmissions may be scheduled by separate signaling or separate configuration, e.g. separate RRC signaling and/or downlink control information signaling. The transmission/s scheduled may represent signaling to be transmitted by the device for which it is scheduled, or signaling to be received by the device for which it is scheduled, depending on which side of a communication the device is. It should be noted that downlink control information or specifically DCI signaling may be considered physical layer signaling, in contrast to higher layer signaling like MAC (Medium Access Control) signaling or RRC layer signaling. The higher the layer of signaling is, the less frequent/the more time/resource consuming it may be considered, at least partially due to the information contained in such signaling having to be passed on through several layers, each layer requiring processing and handling.

A scheduled transmission, and/or transmission timing structure like a mini-slot or slot, may pertain to a specific channel, in particular a physical uplink shared channel, a physical uplink control channel, or a physical downlink shared channel, e.g. PUSCH, PUCCH or PDSCH, and/or may pertain to a specific cell and/or carrier aggregation. A corresponding configuration, e.g. scheduling configuration or symbol configuration may pertain to such channel, cell and/or carrier aggregation. It may be considered that the scheduled transmission represents transmission on a physical channel, in particular a shared physical channel, for example a physical uplink shared channel or physical downlink shared channel. For such channels, semi-persistent configuring may be particularly suitable.

Generally, a configuration may be a configuration indicating timing, and/or be represented or configured with corresponding configuration data. A configuration may be embedded in, and/or comprised in, a message or configuration or corresponding data, which may indicate and/or schedule resources, in particular semi-persistently and/or semi-statically.

A control region of a transmission timing structure may be an interval in time and/or frequency domain for intended or scheduled or reserved for control signaling, in particular downlink control signaling, and/or for a specific control channel, e.g. a physical downlink control channel like PDCCH. The interval may comprise, and/or consist of, a number of symbols in time, which may be configured or configurable, e.g. by (UE-specific) dedicated signaling (which may be single-cast, for example addressed to or intended for a specific UE), e.g. on a PDCCH, or RRC signaling, or on a multicast or broadcast channel. In general, the transmission timing structure may comprise a control region covering a configurable number of symbols. It may be considered that in general the border symbol is configured to be after the control region in time. A control region may be associated, e.g. via configuration and/or determination, to one or more specific UEs and/or formats of PDCCH and/or DCI and/or identifiers, e.g. UE identifiers and/or RNTIs or carrier/cell identifiers, and/or be represented and/or associated to a CORESET and/or a search space.

The duration of a symbol (symbol time length or interval or allocation unit) of the transmission timing structure may generally be dependent on a numerology and/or carrier, wherein the numerology and/or carrier may be configurable. The numerology may be the numerology to be used for the scheduled transmission.

A transmission timing structure may comprise a plurality of allocation units or symbols, and/or define an interval comprising several symbols or allocation units (respectively their associated time intervals). In the context of this disclosure, it should be noted that a reference to a symbol for ease of reference may be interpreted to refer to the time domain projection or time interval or time component or duration or length in time of the symbol, unless it is clear from the context that the frequency domain component also has to be considered. Examples of transmission timing structures include slot, subframe, mini-slot (which also may be considered a substructure of a slot), slot aggregation (which may comprise a plurality of slots and may be considered a superstructure of a slot), respectively their time domain component. A transmission timing structure may generally comprise a plurality of symbols and/or allocation units defining the time domain extension (e.g., interval or length or duration) of the transmission timing structure, and arranged neighboring to each other in a numbered sequence. A timing structure (which may also be considered or implemented as synchronisation structure) may be defined by a succession of such transmission timing structures, which may for example define a timing grid with symbols representing the smallest grid structures. A transmission timing structure, and/or a border symbol or a scheduled transmission may be determined or scheduled in relation to such a timing grid. A transmission timing structure of reception may be the transmission timing structure in which the scheduling control signaling is received, e.g. in relation to the timing grid. A transmission timing structure may in particular be a slot or subframe or in some cases, a mini-slot. In some cases, a timing structure may be represented by a frame structure. Timing structures may be associated to specific transmitters and/or cells and/or beams and/or signalings.

Feedback signaling may be considered a form or control signaling, e.g. uplink or sidelink control signaling, like UCI (Uplink Control Information) signaling or SCI (Sidelink Control Information) signaling. Feedback signaling may in particular comprise and/or represent acknowledgement signaling and/or acknowledgement information and/or measurement reporting.

Signaling utilising, and/or on and/or associated to, resources or a resource structure may be signaling covering the resources or structure, signaling on the associated frequency/ies and/or in the associated time interval/s. It may be considered that a signaling resource structure comprises and/or encompasses one or more substructures, which may be associated to one or more different channels and/or types of signaling and/or comprise one or more holes (resource element/s not scheduled for transmissions or reception of transmissions). A resource substructure, e.g. a feedback resource structure, may generally be continuous in time and/or frequency, within the associated intervals. It may be considered that a substructure, in particular a feedback resource structure, represents a rectangle filled with one or more resource elements in time/frequency space. However, in some cases, a resource structure or substructure, in particular a frequency resource range, may represent a non-continuous pattern of resources in one or more domains, e.g. time and/or frequency. The resource elements of a substructure may be scheduled for associated signaling.

Example types of signaling comprise signaling of a specific communication direction, in particular, uplink signaling, downlink signaling, sidelink signaling, as well as reference signaling (e.g., SRS or CRS or CSI-RS), communication signaling, control signaling, and/or signaling associated to a specific channel like PUSCH, PDSCH, PUCCH, PDCCH, PSCCH, PSSCH, etc.).

In some cases, a shifted object like a signaling or signals or sequences or information may be shifted, e.g. relative to a predecessor (e.g., one is subject to a shift, and the shifted version is used), or relative to another (e.g., one associated to one signaling or allocation unit may be shifted to another associated to a second signaling or allocation unit, both may be used). One possible way of shifting is operating a code on it, e.g. to multiply each element of a shifting object with a factor. A ramping (e.g. multiplying with a monotonously increasing or periodic factor) may be considered an example of shifting. Another is a cyclic shift in a domain or interval. A cyclic shift (or circular shift) may correspond to a rearrangement of the elements in the shifting object, corresponding to moving the final element or elements to the first position, while shifting all other entries to the next position, or by performing the inverse operation (such that the shifted object as the result will have the same elements as the shifting object, in a shifted but similar order). Shifting in general may be specific to an interval in a domain, e.g. an allocation unit in time domain, or a bandwidth in frequency domain. For example, it may be considered that signals or modulation symbols in an allocation unit are shifted, such that the order of the modulation symbols or signals is shifted in the allocation unit. In another example, allocation units may be shifted, e.g. in a larger time interval—this may leave signals in the allocation units unshifted with reference to the individual allocation unit, but may change the order of the allocation units. Domains for shifting may for example be time domain and/or phase domain and/or frequency domain. Multiple shifts in the same domain or different domains, and/or the same interval or different intervals (differently sized intervals, for example) may be performed.

A transmitting radio node may in some variants be represented by, and/or considered or implemented as, a signaling radio node. A receiving radio node in some variants may be represented by, and/or considered or implemented as, feedback radio node.

Synchronisation signaling may be provided by a transmitting (radio) node, e.g. a network node, to allow a receiving (radio) node like a user equipment to identify a cell and/or transmitter, and/or to synchronise to the transmitter and/or cell, and/or to provide information regarding the transmitter and/or cell. Synchronisation signaling may in general comprise one or more components (e.g., different types of signaling), e.g. primary synchronisation signaling (PSS) and/or secondary synchronisation signaling (SSS) and/or broadcast signaling and/or system information (e.g., on a Physical Broadcast Channel). System information (SI) may for example comprise a Master Information Block (MIB) and/or one or more System Information Blocks (SIBs), e.g. at least a SIB1. The different components may be transmitted in a block, e.g. neighboring in time and/or frequency domain. PSS may indicate a transmitter and/or cell identity, e.g. a group of cell and/or transmitter identities the cell belongs to. The SSS may indicate which cell and/or transmitter of the group the cell and/or transmitter the transmitter is associated to and/or represented by (it may be considered that more than one transmitters are associated to the same ID, e.g. in the same cell and/or in a multiple transmission point scenario). PSS may indicate a rougher timing (larger granularity) than the SSS; synchronisation may be based on evaluating PSS and SSS, e.g. in sequence and/or step-wise from a first (rougher) timing to a second (finer) timing. Synchronisation signaling, e.g. PSS and/or SSS, and/or SI may indicate a beam (e.g., beam ID and/or number) and/or beam timing of a beam used for transmitting the synchronisation signaling. Synchronisation signaling may be in form of a SS/PBCH block and/or SSB. It may be considered that synchronisation signaling is transmitted periodically, e.g. every NP ms, e.g. NP=20, 40 or 80. In some cases, synchronisation signaling may be transmitted in bursts, e.g. such that signaling is repeated over more than one synchronisation time interval (e.g., neighboring time intervals, or with gaps between them); a burst may be associated to a burst interval, e.g. within a slot and/or frame and/or a number of NB allocation units, wherein NB may be 100 or less, or 50 or less, or 40 or less or 20 or less. In some cases, a synchronisation time interval may comprise NS allocation units carrying signaling (e.g., PSS and/or SSS and/or PBCH or SI); it may be considered that a burst interval comprises P1 (P1>=1) occasions (thus, P1−1 repetitions) of the synchronisation signaling, and/or comprises at least P1×NS allocation units in time domain; it may be larger than P1×NS units, e.g. to allow for gaps between individual occasions and/or one or more guard interval/s. In some variants, it may comprise at least (P1+1)×NS allocation units, or (P1+2)×NS allocation units, e.g. including gaps between occasions. The synchronisation signaling may be transmitted on, and/or be associated to, a synchronisation bandwidth in frequency space, which may be predefined and/or configured or configurable (e.g., for a receiving node). The synchronisation bandwidth may for example be 100 MHz and/or 500 MHz, or 250 MHz, or another value. A synchronisation bandwidth may be associated to and/or be arranged within a carrier and/or a communication frequency interval. It may be considered that for each carrier and/or frequency interval, there are one or more possible location of a synchronisation bandwidth. PSS and/or SSS may be considered physical layer signaling representing information without having coding (e.g., error coding). Broadcast signaling, e.g. on a PBCH may be coded, in particular comprises error coding like error correction coding, e.g. a CRC.

In the context of this disclosure, there may be distinguished between dynamically scheduled or aperiodic transmission and/or configuration, and semi-static or semi-persistent or periodic transmission and/or configuration. The term "dynamic" or similar terms may generally pertain to configuration/transmission valid and/or scheduled and/or configured for (relatively) short timescales and/or a (e.g., predefined and/or configured and/or limited and/or definite) number of occurrences and/or transmission timing structures, e.g. one or more transmission timing structures like slots or slot aggregations, and/or for one or more (e.g., specific number) of transmission/occurrences. Dynamic configuration may be based on low-level signaling, e.g. control signaling on the physical layer and/or MAC layer, in particular in the form of DCI or SCI. Periodic/semi-static may pertain to longer timescales, e.g. several slots and/or more than one frame, and/or a non-defined number of occurrences, e.g., until a dynamic configuration contradicts, or until a new periodic configuration arrives. A periodic or semi-static configuration may be based on, and/or be configured with, higher-layer signaling, in particular RCL layer signaling and/or RRC signaling and/or MAC signaling.

In this disclosure, for purposes of explanation and not limitation, specific details are set forth (such as particular network functions, processes and signaling steps) in order to provide a thorough understanding of the technique presented herein. It will be apparent to one skilled in the art that the present concepts and aspects may be practiced in other variants and variants that depart from these specific details.

For example, the concepts and variants are partially described in the context of Long Term Evolution (LTE) or LTE-Advanced (LTE-A) or New Radio mobile or wireless communications technologies; however, this does not rule out the use of the present concepts and aspects in connection with additional or alternative mobile communication technologies such as the Global System for Mobile Communications (GSM) or IEEE standards as IEEE 802.11ad or IEEE 802.11 ay. While described variants may pertain to certain Technical Specifications (TSs) of the Third Generation Partnership Project (3GPP), it will be appreciated that the present approaches, concepts and aspects could also be realized in connection with different Performance Management (PM) specifications.

Moreover, those skilled in the art will appreciate that the services, functions and steps explained herein may be implemented using software functioning in conjunction with a programmed microprocessor, or using an Application Specific Integrated Circuit (ASIC), a Digital Signal Processor (DSP), a Field Programmable Gate Array (FPGA) or general purpose computer. It will also be appreciated that while the variants described herein are elucidated in the context of methods and devices, the concepts and aspects presented herein may also be embodied in a program product as well as in a system comprising control circuitry, e.g. a computer processor and a memory coupled to the processor, wherein the memory is encoded with one or more programs or program products that execute the services, functions and steps disclosed herein.

It is believed that the advantages of the aspects and variants presented herein will be fully understood from the foregoing description, and it will be apparent that various changes may be made in the form, constructions and arrangement of the exemplary aspects thereof without departing from the scope of the concepts and aspects described herein or without sacrificing all of its advantageous effects. The aspects presented herein can be varied in many ways.

Some useful abbreviations comprise

| Abbreviation | Explanation |
| --- | --- |
| ACK/NACK | Acknowledgment/Negative Acknowledgement |
| ARQ | Automatic Repeat reQuest |
| BER | Bit Error Rate |
| BLER | Block Error Rate |

-continued

| Abbreviation | Explanation |
| --- | --- |
| BPSK | Binary Phase Shift Keying |
| BWP | BandWidth Part |
| CAZAC | Constant Amplitude Zero Cross Correlation |
| CB | Code Block |
| CBB | Code Block Bundle |
| CBG | Code Block Group |
| CDM | Code Division Multiplex |
| CM | Cubic Metric |
| CORESET | Control Resource Set |
| CQI | Channel Quality Information |
| CRC | Cyclic Redundancy Check |
| CRS | Common reference signal |
| CSI | Channel State Information |
| CSI-RS | Channel state information reference signal |
| DAI | Downlink Assignment Indicator |
| DCI | Downlink Control Information |
| DFT | Discrete Fourier Transform |
| DFTS-FDM | DFT-spread-FDM |
| DM(-)RS | Demodulation reference signal(ing) |
| eMBB | enhanced Mobile BroadBand |
| FDD | Frequency Division Duplex |
| FDE | Frequency Domain Equalisation |
| FDF | Frequency Domain Filtering |
| FDM | Frequency Division Multiplex |
| HARQ | Hybrid Automatic Repeat Request |
| IAB | Integrated Access and Backhaul |
| IFFT | Inverse Fast Fourier Transform |
| Im | Imaginary part, e.g. for pi/2*BPSK modulation |
| IR | Impulse Response |
| ISI | Inter Symbol Interference |
| MBB | Mobile Broadband |
| MCS | Modulation and Coding Scheme |
| MIMO | Multiple-input-multiple-output |
| MRC | Maximum-ratio combining |
| MRT | Maximum-ratio transmission |
| MU-MIMO | Multiuser multiple-input-multiple-output |
| OFDM/A | Orthogonal Frequency Division Multiplex/Multiple Access |
| PAPR | Peak to Average Power Ratio |
| PDCCH | Physical Downlink Control Channel |
| PDSCH | Physical Downlink Shared Channel |
| PRACH | Physical Random Access CHannel |
| PRB | Physical Resource Block |
| PUCCH | Physical Uplink Control Channel |
| PUSCH | Physical Uplink Shared Channel |
| (P)SCCH | (Physical) Sidelink Control Channel |
| PSS | Primary Synchronisation Signal(ing) |
| PT-RS | Phase Tracking Reference Signaling |
| (P)SSCH | (Physical) Sidelink Shared Channel |
| QAM | Quadrature Amplitude Modulation |
| OCC | Orthogonal Cover Code |
| QPSK | Quadrature Phase Shift Keying |
| PSD | Power Spectral Density |
| RAN | Radio Access Network |
| RAT | Radio Access Technology |
| RB | Resource Block |
| RE | Resource Element |
| Re | Real part (e.g., for pi/2*BPSK) modulation |
| RNTI | Radio Network Temporary Identifier |
| RRC | Radio Resource Control |
| RX | Receiver, Reception, Reception-related/side |
| SA | Scheduling Assignment |
| SC-FDE | Single Carrier Frequency Domain Equalisation |
| SC-FDM/A | Single Carrier Frequency Division Multiplex/Multiple Access |
| SCI | Sidelink Control Information |
| SINR | Signal-to-interference-plus-noise ratio |
| SIR | Signal-to-interference ratio |
| SNR | Signal-to-noise-ratio |
| SR | Scheduling Request |
| SRS | Sounding Reference Signal(ing) |
| SSS | Secondary Synchronisation Signal(ing) |
| SVD | Singular-value decomposition |
| TB | Transport Block |

-continued

| Abbreviation | Explanation |
| --- | --- |
| TDD | Time Division Duplex |
| TDM | Time Division Multiplex |
| T-RS | Tracking Reference Signaling or Timing Reference Signaling |
| TX | Transmitter, Transmission, Transmission-related/side |
| UCI | Uplink Control Information |
| UE | User Equipment |
| URLLC | Ultra Low Latency High Reliability Communication |
| VL-MIMO | Very-large multiple-input-multiple-output |
| ZF | Zero Forcing |
| ZP | Zero-Power, e.g. muted CSI-RS symbol |

Abbreviations may be considered to follow 3GPP usage if applicable.

The invention claimed is:

1. A method of operating a transmitting radio node in a wireless communication network, the method comprising:
transmitting data signaling utilising a plurality of layers, the data signaling representing a plurality of code blocks; and
mapping modulation symbols of a modulation symbol sequence to the plurality of layers in c-tuples, the modulation symbol sequence representing the plurality of code blocks, c being dependent on the modulation used for transmitting the signaling, c being a number of consecutive modulation symbols, bits of the modulation symbol sequence including interleaved bits from different code blocks, the mapping of modulation symbols being according to a modulation scheme selected from a set of modulation schemes comprising inter-linking and non-interlinking modulations based at least in part on at least one of a channel estimate, a signal quality and a signal strength.

2. The method according to claim 1, wherein for at least one of different sets of modulations and for different modulations, c is different.

3. The method according to claim 1, wherein for a first set of modulations, c is at least one of 2 and even.

4. The method according to claim 1, wherein for a second set of modulations, c is an odd number.

5. The method according to claim 1, wherein for at least one of pi/2 binary phase shift keying (pi/2*BPSK) modulation and an interlinked modulation, c is one of 2 and an even number larger than 2.

6. The method according to claim 1, wherein for at least one of a quadrature amplitude modulation (QAM)-based modulation and quadrature phase shift keying (QPSK), c is an odd number larger than 1.

7. The method according to claim 1, wherein the code blocks of the plurality of code blocks are associated to a same data block and are interleaved based on c.

8. The method according to claim 7, where the same data block is one of a same code block bundle and transport block.

9. The method according to claim 1, wherein interleaving is performed on a code block basis and on a data block basis.

10. The method according to claim 1, wherein the modulation symbol sequence is based on interleaving of bits of the code blocks of the plurality of code blocks.

11. A transmitting radio node for a wireless communication network, the transmitting radio node being configured for:

data signaling utilising a plurality of layers, the data signaling represents representing a plurality of code blocks; and mapping modulation symbols of a modulation symbol sequence to the plurality of layers in c-tuples, the modulation symbol sequence representing the plurality of code blocks, c being a number of consecutive modulation symbols and being dependent on the modulation used for transmitting the signaling, bits of the modulation symbol sequence including interleaved bits from different code blocks, the mapping of modulation symbols being according to a modulation scheme selected from a set of modulation schemes comprising interlinking and non-interlinking modulations based at least in part on at least one of a channel estimate, a signal quality and a signal strength.

12. A method of operating a receiving radio node in a wireless communication network, the method comprising:

receiving data signaling, the data signaling being transmitted utilising a plurality of layers, the data signaling represents representing a plurality of code blocks; and modulation symbols of a modulation symbol sequence being mapped to the plurality of layers in c-tuples, the modulation symbol sequence representing the plurality of code blocks, c being a number of consecutive modulation symbols and being dependent on the modulation used for transmitting the signaling, bits of the modulation symbol sequence including interleaved bits from different code blocks, the mapping of modulation symbols being according to a modulation scheme selected from a set of modulation schemes comprising interlinking and non-interlinking modulations based at least in part on at least one of a channel estimate, a signal quality and a signal strength.

13. The method according to claim 12, wherein for at least one of different sets of modulations and for different modulations, c is different.

14. The method according to claim 12, wherein for a first set of modulations, c is at least one of 2 and even.

15. The method according to claim 12, wherein for a second set of modulations, c is an odd number.

16. The method according to claim 12, wherein for at least one of pi/2 binary phase shift keying (pi/2*BPSK) modulation and an interlinked modulation, c is one of 2 and an even number larger than 2.

17. The method according to claim 12, wherein for at least one of a quadrature amplitude modulation (QAM)-based modulation and quadrature phase shift keying (QPSK), c is an odd number larger than 1.

18. A receiving radio node for a wireless communication network, the receiving radio node being configured to:

receive data signaling, the data signaling being transmitted utilising a plurality of layers, the data signaling representing a plurality of code blocks; and modulation symbols of a modulation symbol sequence being mapped to the plurality of layers in c-tuples, the modulation symbol sequence representing the plurality of code blocks, c being a number of consecutive modulation symbols and being dependent on the modulation used for transmitting the signaling, bits of the modulation symbol sequence including interleaved bits from different code blocks, the mapping of modulation symbols being according to a modulation scheme selected from a set of modulation schemes comprising interlinking and non-interlinking modulations based at least in part on at least one of a channel estimate, a signal quality and a signal strength.

19. A non-transitory computer storage medium storing a computer program comprising instructions causing processing circuitry to at least one of control and perform a method, the method comprising:

transmitting data signaling utilising a plurality of layers, the data signaling representing a plurality of code blocks; and mapping modulation symbols of a modulation symbol sequence to the plurality of layers in c-tuples, the modulation symbol sequence representing the plurality of code blocks, c being a number of consecutive modulation symbols and being dependent on the modulation used for transmitting the signaling, bits of the modulation symbol sequence including interleaved bits from different code blocks, the mapping of modulation symbols being according to a modulation scheme selected from a set of modulation schemes comprising interlinking and non-interlinking modulations based at least in part on at least one of a channel estimate, a signal quality and a signal strength.

* * * * *